United States Patent
He et al.

(10) Patent No.: US 12,201,001 B2
(45) Date of Patent: Jan. 14, 2025

(54) ARRAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Fan He, Beijing (CN); Xiangdan Dong, Beijing (CN); Yunsheng Xiao, Beijing (CN); Mengmeng Du, Beijing (CN); Bo Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 873 days.

(21) Appl. No.: 17/296,699

(22) PCT Filed: Oct. 30, 2020

(86) PCT No.: PCT/CN2020/125006
§ 371 (c)(1),
(2) Date: May 25, 2021

(87) PCT Pub. No.: WO2021/093600
PCT Pub. Date: May 20, 2021

(65) Prior Publication Data
US 2022/0028933 A1  Jan. 27, 2022

(30) Foreign Application Priority Data
Nov. 15, 2019 (CN) .......................... 201911122242.7

(51) Int. Cl.
*H10K 59/40* (2023.01)
*G06F 3/041* (2006.01)
(Continued)

(52) U.S. Cl.
CPC ........... *H10K 59/40* (2023.02); *G06F 3/0412* (2013.01); *G06F 3/0446* (2019.05);
(Continued)

(58) Field of Classification Search
CPC .... H10K 59/40; H10K 50/844; H10K 59/124; H10K 2102/311; H10K 59/131;
(Continued)

(56) References Cited

U.S. PATENT DOCUMENTS 10,890,995 B2 *  1/2021  Lee ..................... G06F 3/044
11,329,254 B2 *  5/2022  Wang .................. H10K 59/40
(Continued)

FOREIGN PATENT DOCUMENTS

CN  106873839 A1  6/2017
CN  108649138 A  10/2018
(Continued)

OTHER PUBLICATIONS

International Search Report for corresponding international application No. PCT/CN2020/125006, dated Jan. 29, 2021. 4 pages.

*Primary Examiner* — Kevin Quarterman
(74) *Attorney, Agent, or Firm* — Leason Ellis LLP

(57) ABSTRACT

An array substrate and a display device are provided. The array substrate includes: a base substrate, a planarization layer, a package layer, a first barrier wall, and a plurality of first transmission lines. The first barrier wall is in a peripheral region and includes a first barrier wall portion extending along a first direction; and the plurality of first transmission lines are in the peripheral region and at a side of the package layer away from the base substrate. The package layer includes an organic package layer, the planarization layer incudes a first edge portion extending along the first direction, and an orthographic projection of at least one of the plurality of first transmission lines on the base substrate is (Continued)

located at a side of the orthographic projection on the first edge portion on the base substrate away from the display region.

17 Claims, 7 Drawing Sheets

(51) Int. Cl.
    *G06F 3/044*     (2006.01)
    *H10K 50/844*     (2023.01)
    *H10K 59/124*     (2023.01)
    *H10K 102/00*     (2023.01)

(52) U.S. Cl.
    CPC ......... *H10K 50/844* (2023.02); *H10K 59/124* (2023.02); *H10K 2102/311* (2023.02)

(58) Field of Classification Search
    CPC . H10K 59/8731; G06F 3/0412; G06F 3/0446; G06F 2203/04102; G06F 3/04164; G06F 2203/04103
    See application file for complete search history.

(56) References Cited

U.S. PATENT DOCUMENTS

| | | |
|---|---|---|
| 2018/0233541 A1 | 8/2018 | Zeng et al. |
| 2018/0348934 A1* | 12/2018 | Matsumoto ........... G06F 3/0443 |
| 2019/0103443 A1 | 4/2019 | Kim et al. |
| 2020/0144341 A1* | 5/2020 | Choi ................... H10K 59/124 |

FOREIGN PATENT DOCUMENTS

| | | |
|---|---|---|
| CN | 110265459 A | 9/2019 |
| CN | 210379052 U | 4/2020 |

* cited by examiner

ARRAY SUBSTRATE AND DISPLAY DEVICE

CROSS-REFERENCE TO RELATED PATENT APPLICATIONS

This application is a U.S. National Phase Entry of International Application No. PCT/CN2020/125006 filed on Oct. 30, 2020, designating the United States of America and claiming priority to Chinese Patent Application No. 201911122242.7, filed on Nov. 15, 2019. The present application claims priority to and the benefit of the above-identified applications and the above-identified applications are incorporated by reference herein in their entirety.

TECHNICAL FIELD

Embodiments of the present disclosure relate to an array substrate and a display device.

BACKGROUND

With the continuous development of touch technology, smart electronic products such as mobile phones and tablet computers are integrated with touch substrates with touch functions. On the other hand, with the rapid development of functional electronic products such as mobile phones and tablet computers, smart electronic products such as mobile phones and tablet computers gradually adopt the narrow frame design and even frameless design, that is, the "full screen" design, thus providing users with better use experience.

SUMMARY

Embodiments of the disclosure provide an array substrate and a display device. In the array substrate, at least a part of the transmission lines is arranged on the slope portion of the package layer, such that the width of the periphery region is reduced, and narrow frame design or even frameless design of the display device adopting the array substrate is realized.

At least one embodiment of the disclosure provides an array substrate, comprising: a base substrate, comprising a display region and a peripheral region at the periphery of the display region; a planarization layer on the base substrate; a package layer at a side of the planarization layer away from the base substrate; a first barrier wall in the peripheral region and comprising a first barrier wall portion extending along a first direction; and a plurality of first transmission lines in the peripheral region and at a side of the package layer away from the base substrate, each of the plurality of first transmission lines extending along the first direction and arranged along a second direction which is substantially perpendicular to the first direction, wherein the package layer comprises an organic package layer, the planarization layer comprises a first edge portion extending along the first direction, the first edge portion is located between the first barrier wall portion and the display region, an orthographic projection of the first edge portion on the base substrate is covered by an orthographic projection of the organic package layer on the base substrate, and an orthographic projection of at least one of the plurality of first transmission lines on the base substrate is located at a side of the orthographic projection of the first edge portion on the base substrate away from the display region.

For example, in the array substrate according to an embodiment of the disclosure, the organic package layer comprises a second edge portion extending along the first direction, and the second edge portion is located between the first edge portion and the first bather wall portion, and an orthographic projection of at least one of the plurality of first transmission lines on the base substrate is located within an orthographic projection of the second edge portion on the base substrate.

For example, in the array substrate according to an embodiment of the disclosure, the plurality of first transmission lines comprise a plurality of first flat transmission lines at a side of the first edge portion away from the base substrate and a plurality of first slope transmission lines at a side of the second edge portion away from the base substrate, a distance between two adjacent ones of the plurality of first slope transmission lines is larger than a distance between two adjacent ones of the plurality of first flat transmission lines.

For example, in the array substrate according to an embodiment of the disclosure, the distance between two adjacent ones of the plurality of first slope transmission lines is 1.05-2 times of the distance between two adjacent ones of the plurality of first flat transmission lines.

For example, in the array substrate according to an embodiment of the disclosure, among the plurality of first slope transmission lines, the distance between two adjacent ones of the plurality of first slope transmission lines is 1.05-2 times of a width of each of the plurality of first slope transmission lines.

For example, the array substrate according to an embodiment of the disclosure further comprises: a pixel driving layer on the base substrate; and an organic light emitting element at a side of the planarization layer away from the pixel driving layer, wherein the planarization layer is located at a side of the pixel driving layer away from the base substrate, and the package layer is located at a side of the organic light emitting element away from the base substrate.

For example, in the array substrate according to an embodiment of the disclosure, one of the plurality of first transmission lines that is farthest from the display region is a part of a ground line, and an orthographic projection of the one of the plurality of first transmission lines that is farthest from the display region on the base substrate is located between the orthographic projection of the organic package layer on the base substrate and an orthographic projection of the first barrier wall portion on the base substrate.

For example, the array substrate according to an embodiment of the disclosure, further comprises: a plurality of touch driving electrodes in the display region and at a side of the package layer away from the base substrate; a plurality of touch sensing electrodes in the display region and at a side of the package layer away from the base substrate; touch driving signal lines connected with the respective ones of the plurality of touch driving electrodes and extending to the peripheral region; and touch sensing signal lines connected with the respective ones of the plurality of touch sensing electrodes and extending to the peripheral region, wherein at least a part of the plurality of first transmission lines are a part of the touch driving signal lines or the touch sensing signal lines.

For example, in the array substrate according to an embodiment of the disclosure, the first barrier wall comprises a second barrier wall portion extending along the second direction, and the array substrate further comprises: a plurality of second transmission lines extending along the second direction, wherein the planarization layer comprises a third edge portion extending along the second direction, the third edge portion is located between the second barrier wall portion and the display region, an orthographic projection of the third edge portion on the base substrate is covered by the orthographic projection of the organic package layer on the base substrate, and an orthographic projection of at least one of the plurality of second transmission lines on the base substrate is located at a side of the third edge portion away from the display region.

For example, the array substrate according to an embodiment of the disclosure further comprises: a plurality of touch driving electrodes in the display region and at a side of the package layer away from the base substrate; a plurality of touch sensing electrodes in the display region and at a side of the package layer away from the base substrate; touch driving signal lines connected with the respective ones of the plurality of touch driving electrodes and extending to the peripheral region; and touch sensing signal lines connected with the respective ones of the plurality of touch sensing electrodes and extending to the peripheral region, wherein each of the plurality of touch sensing electrodes extends along the first direction, the plurality of touch sensing electrodes are arranged along the second direction, at least a part of the plurality of first transmission lines are a part of the touch sensing signal lines, each of the plurality of touch driving electrodes extends along the second direction, the plurality of touch driving electrodes are arranged along the first direction, and at least a part of the plurality of second transmission lines are a part of the touch driving signal lines.

For example, in the array substrate according to an embodiment of the disclosure, the organic package layer comprises a fourth edge portion extending along the second direction, the fourth edge portion is located between the third edge portion and the second barrier wall portion, and the orthographic projection of at least one of the plurality of second transmission lines on the base substrate is located within an orthographic projection of the fourth edge portion on the base substrate.

For example, in the array substrate according to an embodiment of the disclosure, the plurality of second transmission lines comprise a plurality of second flat transmission lines located at a side of the third edge portion away from the base substrate and a plurality of second slope transmission lines located at a side of the fourth edge portion away from the base substrate, a distance between two adjacent ones of the plurality of second slope transmission lines is larger than a distance between two adjacent ones of the plurality of second flat transmission lines.

For example, in the array substrate according to an embodiment of the disclosure, the distance between two adjacent ones of the plurality of second slope transmission lines is 1.05-2 times of the distance between two adjacent ones of the plurality of second flat transmission lines.

For example, in the array substrate according to an embodiment of the disclosure, among the plurality of second slope transmission lines, the distance between two adjacent ones of the plurality of second slope transmission lines is greater than or equal to 1.05-2 times of a width of each of the plurality of first slope transmission lines.

For example, the array substrate according to an embodiment of the disclosure further comprises: a second barrier wall on the base substrate and in the peripheral region, wherein the second barrier wall is located between the first barrier wall and the display region, and comprises a third barrier wall portion extending along the first direction, the orthographic projection of at least one of the plurality of first transmission lines on the base substrate is located within an orthographic projection of the third barrier wall portion on the base substrate.

For example, the array substrate according to an embodiment of the disclosure further comprises: a second barrier wall on the base substrate and in the peripheral region, wherein the second barrier wall is located between the first barrier wall and the display region, and comprises a third barrier wall portion extending along the first direction, the orthographic projection of the plurality of first transmission lines on the base substrate is located at a side of an orthographic projection of the third barrier wall portion on the base substrate close to the display region.

For example, in the array substrate according to an embodiment of the disclosure, the organic light emitting element comprises an anode, a light emitting layer and a cathode which are sequentially stacked in a direction away from the base substrate.

For example, in the array substrate according to an embodiment of the disclosure, the package layer further comprises: a first inorganic package layer at a side of the organic light emitting element away from the base substrate; and a second inorganic package layer at a side of the organic package layer away from the first inorganic package layer, wherein the first inorganic package layer and the second inorganic package layer cover the first barrier wall, the organic package layer is sandwiched between the first inorganic package layer and the second inorganic package layer, and the plurality of first transmission lines are located at a side of the second inorganic package layer away from the base substrate.

At least one embodiment of the disclosure further provides an array substrate, comprising: a base substrate, comprising a display region and a peripheral region at the periphery of the display region; a pixel driving layer on the base substrate; an organic light emitting element on the pixel driving layer; a package layer on the organic light emitting element, the package layer comprising a first inorganic package layer and an organic package layer which are sequentially arranged; a plurality of first transmission lines in the peripheral region and at a side of the package layer away from the base substrate, each of the plurality of first transmission lines extending along a first direction, and the plurality of first transmission lines being arranged along a second direction, the second direction being substantially perpendicular to the first direction; wherein, in the peripheral region, the first inorganic package layer comprises a first inorganic package portion, an inorganic package connection portion and a second inorganic package portion which are continuously arranged in a direction from the display region to the peripheral region, and the inorganic package connection portion is configured to connect the first inorganic package portion and the second inorganic package portion; in the peripheral region, the organic package layer comprises a first organic package portion and a second organic package portion which are arranged continuously in the direction from the display region to the peripheral region, an edge of the second organic package portion away from the display region is an edge of the organic package layer, and an orthographic projection of the first organic package portion on the base substrate is overlapped with orthographic projections of the first inorganic package portion and the inorganic package connection portion on the base substrate, and an orthographic projection of the second organic package portion on the base substrate is overlapped with an orthographic projection of the second inorganic package portion on the base substrate; in a direction perpendicular to the base substrate, a distance d1 between the first inorganic package portion and the base substrate is larger than a distance d2 between the second inorganic package portion and the base substrate, and an orthographic projection of at least one of the plurality of first transmission lines on the base substrate falls within the orthographic projection of the second inorganic package portion on the base substrate.

For example, the array substrate according to an embodiment of the disclosure further comprises: a first barrier wall in the peripheral region and comprising a first barrier wall portion extending along the first direction; and a planarization layer at a side of the pixel driving layer away from the base substrate, wherein the planarization layer comprises a first edge portion extending along the first direction, the first edge portion is located between the first barrier wall portion and the display region, and the orthographic projections of the first inorganic package portion and the inorganic package connection portion on the base substrate are overlapped with an orthographic projection of the first edge portion on the base substrate, a difference between the distance d1 between the first inorganic package portion and the base substrate and the distance d2 between the second inorganic package portion and the base substrate is greater than or equal to a maximum thickness of a portion of the planarization layer which is overlapped with the inorganic package connection portion in the direction perpendicular to the base substrate.

For example, in the array substrate according to an embodiment of the disclosure, the planarization layer comprises: a first sub planarization layer at a side of the pixel driving layer away from the base substrate; and a second sub planarization layer at a side of the first sub planarization layer away from the pixel driving layer, wherein the difference between the distance d1 between the first inorganic package portion and the base substrate and the distance d2 between the second inorganic package portion and the base substrate is greater than or equal to a sum of a maximum thickness of the first sub planarization layer which is overlapped with the inorganic package connection portion in the direction perpendicular to the base substrate and a maximum thickness of the second sub planarization layer which is overlapped with the inorganic package connection portion in the direction perpendicular to the base substrate.

For example, in the array substrate according to an embodiment of the disclosure, the plurality of first transmission lines comprise a plurality of first flat transmission lines at a side of the first organic package portion away from the base substrate and a plurality of first slope transmission lines at a side of the second organic package portion away from the base substrate, a distance between two adjacent ones of the plurality of first slope transmission lines is larger than a distance between two adjacent ones of the plurality of first flat transmission lines.

For example, in the array substrate according to an embodiment of the disclosure, the distance between two adjacent ones of the plurality of first slope transmission lines is 1.05-2 times of the distance between two adjacent ones of the plurality of first flat transmission lines.

For example, in the array substrate according to an embodiment of the disclosure, among the plurality of first slope transmission lines, the distance between two adjacent ones of the plurality of first slope transmission lines is 1.05-2 times of a width of each of the plurality of first slope transmission lines.

At least one embodiment of the disclosure further provides a display device comprising the array substrate according to items as mentioned above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise specified, the technical terms or scientific terms used in the disclosure shall have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly.

At present, in order to achieve the lightweight design of a display device (for example, an organic light emitting diode display device), a display panel and a touch structure can be integrated together. Therefore, FMLOC (flexible multiple layer on cell) touch technology came into being, FMLOC touch technology is to directly manufacture various electrode layers and various wirings of touch structure on a package layer, thus integrating the touch structure on a display panel. Therefore, the display device using FMLOC touch technology can not only achieve the lightweight design of the display device, but also achieve flexible display and flexible touch.

Figure 1:
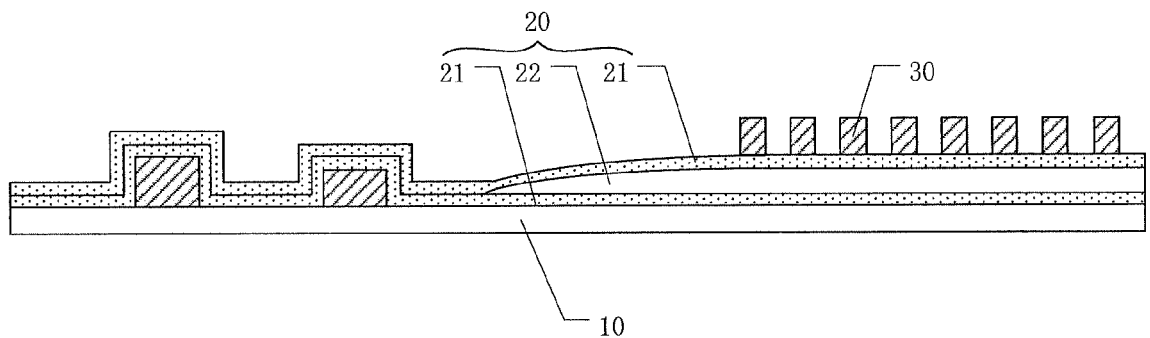
FIG. 1 is a schematic cross-sectional view of a peripheral region of an array substrate.

In a display device adopting FMLOC touch technology, signal transmission lines connected with a touch driving electrode (Tx) and a touch sensing electrode (Rx) are arranged in a peripheral region of the display device. FIG. 1 is a schematic cross-sectional view of a peripheral region of an array substrate. As illustrated by FIG. 1, a package layer 20 is disposed on a base substrate 10, the package layer 20 includes two inorganic package layers 21 and an organic package layer 22 sandwiched between the two inorganic package layers 21; a surface of the package layer 20 away from the base substrate 10 is provided with signal lines 30 connected with a touch driving electrode (Tx) and a touch sensing electrode (Rx). Because the organic package layer 22 will undergo a leveling process, a slope portion with gradually decreasing thickness will be formed in the peripheral region of the array substrate. In order to avoid the influence of the slope portion on the signal lines 30, the signal lines 30 are usually formed at a position corresponding to a flat portion of the organic package layer 22, which leads to a large width of the peripheral region, and is not conducive to achieving the narrow frame design of the display device.

Figure 2:
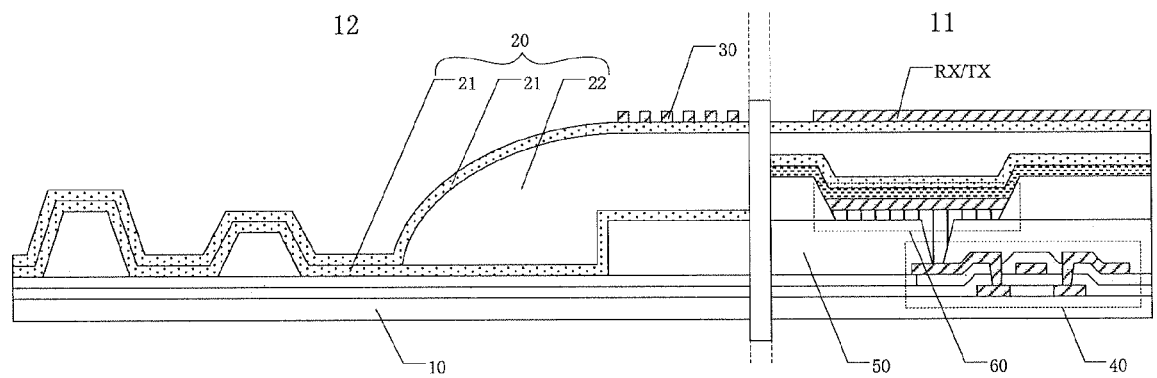
FIG. 2 is a schematic cross-sectional view of a peripheral region of another array substrate.

FIG. 2 is a schematic cross-sectional view of another array substrate. As illustrated by FIG. 2, the array substrate includes a base substrate 10, a package layer 20, a signal line 30, a pixel driving layer 40, a planarization layer 50 and an organic light emitting element 60. The base substrate 10 includes a display region 11 and a peripheral region 12 around the display region 11; the pixel driving layer 40 is located on the base substrate 10 and in the display region 11 of the base substrate 10; the planarization layer 50 is located at a side of the pixel driving layer 40 away from the base substrate 10; the organic light emitting element 60 is located at a side of the planarization layer 50 away from the pixel driving layer 40; the package layer 20 is located at a side of the organic light emitting element 60 away from the base substrate 10; the package layer 20 includes two inorganic package layers 21 and an organic package layer 22 sandwiched between the two inorganic package layers 21, a surface of the package layer 20 away from the base substrate 10 is provided with signal lines 30 connected with a touch driving electrode (Tx) and a touch sensing electrode (Rx). Because the planarization layer 50 is not arranged on the entire surface of the base substrate, a distance between the package layer 20 on the planarization layer 50 and the base substrate 10 will suddenly decrease at an edge of the planarization layer 50, and the organic package layer 22 will undergo a leveling process, thus fainting a slope portion with gradually decreasing thickness in the peripheral region of the array substrate. In order to avoid the influence of the slope portion on the signal lines 30, the signal lines 30 are usually formed at a position corresponding to a flat portion of the organic package layer 22, that is, a position over the planarization layer. Therefore, a width of the frame of the display device adopting the array substrate includes a width of the slope portion and a width of the flat portion, and the width of the flat portion is relatively large, which is not conducive to achieving the narrow frame design.

On the other hand, with the development of narrow frame design, the frame of the display device is getting narrower and narrower, and space for the above signal lines is getting smaller and smaller. In this case, it is not enough to solve the wiring requirements of the display device with narrow frame design only by reducing line width and line spacing.

In this regard, embodiments of the present disclosure provide an array substrate and a display device. The array substrate includes a base substrate, a pixel driving layer, a planarization layer, an organic light emitting element, a package layer, a first barrier wall and a plurality of first transmission lines. The base substrate includes a display region and a peripheral region located at the periphery of the display region; the pixel driving layer is located on the base substrate; the planarization layer is located at a side of the pixel driving layer away from the base substrate; the organic light emitting device is located at a side of the planarization layer away from the pixel driving layer; the package layer is located at a side of the organic light emitting element away from the base substrate; the first barrier wall is located in the peripheral region and includes a first barrier wall portion extending along a first direction; the plurality of first transmission lines are located in the peripheral region and at a side of the package layer away from the base substrate, each of the plurality of first transmission lines extends along the first direction, and the plurality of first transmission lines are arranged along a second direction which is substantially perpendicular to the first direction; the package layer includes an organic package layer, and the planarization layer includes a first edge portion extending along the first direction, the first edge portion is located between the first barrier wall portion and the display region, an orthographic projection of the first edge portion on the base substrate is covered by an orthographic projection of the organic package layer on the base substrate, and an orthographic projection of at least one of the plurality of first transmission lines on the base substrate is located at a side of the first edge portion away from the display region. Therefore, the array substrate can reduce width of the peripheral region by arranging at least one of the plurality of first transmission lines at a side of the first edge portion away from the display region (i.e., a slope portion of the package layer), thereby achieving the narrow frame or even frameless design of the display device adopting the array substrate.

Hereinafter, the array substrate and the display device provided by the embodiments of the present disclosure will be described in detail with reference to the accompanying drawings.

Figure 3:
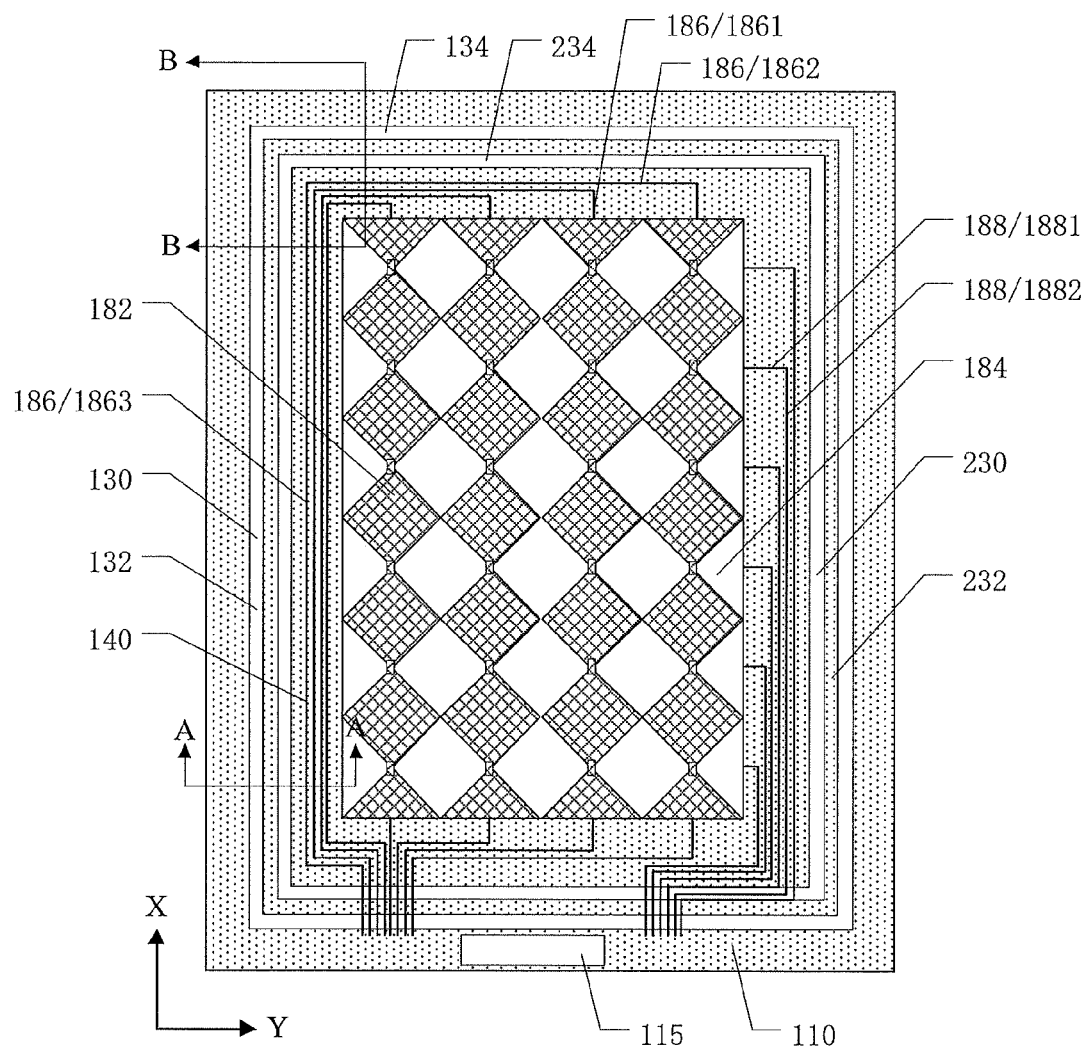
FIG. 3 is a schematic plan view of an array substrate according to an embodiment of the present disclosure.
Figure 4:
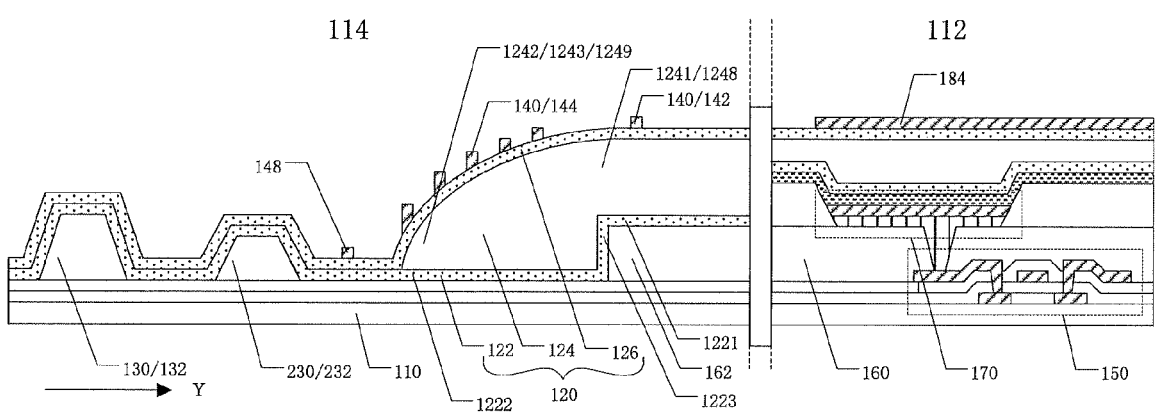
FIG. 4 is a schematic cross-sectional view of an array substrate according to an embodiment of the present disclosure along the AA direction in FIG. 3.

FIG. 3 is a schematic plan view of an array substrate according to an embodiment of the present disclosure; FIG. 4 is a schematic cross-sectional view of an array substrate according to an embodiment of the present disclosure along the AA direction in FIG. 3. As illustrated by FIGS. 3 and 4, the array substrate 100 includes a base substrate 110, a pixel driving layer 150, a planarization layer 160, an organic light emitting element 170, a package layer 120, a first barrier wall 130 and a plurality of first transmission lines 140. The base substrate 110 includes a display region 112 and a peripheral region 114 located around the display region 112, the pixel driving layer 150 is located on the base substrate 110; the planarization layer 160 is located at a side of the pixel driving layer 150 away from the base substrate 110, the organic light emitting element 170 is located at a side of the planarization layer 160 away from the pixel driving layer 150; the package layer 120 is located at a side of the organic light emitting element 170 away from the base substrate 110, the first barrier wall 130 is located in the peripheral region 114 and includes a first barrier wall portion 132 extending along a first direction, the plurality of first transmission lines 140 are located in the peripheral region 114 and at a side of the package layer 120 away from the base substrate 110, each of the plurality of first transmission lines 140 extends along a first direction X, and the plurality of first transmission lines 140 are arranged along a second direction Y, which is substantially perpendicular to the first direction. It should be noted that the abovementioned pixel driving layer may include a pixel circuit for driving the corresponding organic light emitting element to perform light emitting display. In addition, the abovementioned expression that the second direction is substantially perpendicular to the first direction includes the case where an included angle between the first direction and the second direction is equal to 90 degrees and the case where the included angle between the first direction and the second direction is greater than 80 degrees and less than 100 degrees.

As illustrated by FIGS. 3 and 4, the package layer 120 may be directly disposed on the base substrate 110 in some regions, or other film structures such as the pixel driving layer 150, the planarization layer 160, the organic light emitting element 170 may be disposed between the package layer 120 and the base substrate 110. The package layer 120 can package the pixel driving layer 150 and the organic light emitting element 170 formed on the base substrate 110, and prevent water and oxygen in the external environment from corroding the pixel driving layer 150 and the organic light emitting element 170. The first barrier wall 130 is disposed on the base substrate 110 and located in the peripheral region 114, the first barrier wall 130 can block a fluid material in the package layer 120 from flowing out of the first barrier wall 130 during forming the package layer 120.

As illustrated by FIG. 3 and FIG. 4, the package layer 120 includes an organic package layer 124, and the planarization layer 160 includes a first edge portion 162 extending along the first direction X, which is located between the first barrier wall portion 132 and the display region 112, an orthographic projection of the first edge portion 162 on the base substrate 110 is covered by an orthographic projection of the organic package layer 124 on the base substrate 110, and an orthographic projection of at least one of the plurality of first transmission lines 140 on the base substrate 110 is located at a side of the first edge portion 162 away from the display region 112.

In the array substrate provided by the embodiment of the present disclosure, because the planarization layer 160 is not arranged on the entire surface of the array substrate, a distance between the package layer 120 and the base substrate 110 will suddenly decrease at the first edge portion 162, and the organic package layer 124 will undergo a leveling process, thus forming a first slope portion 1243 with gradually decreasing thickness in the peripheral region 114, while a portion of the organic package layer 124 above the first edge portion 162 is a first flat portion 1241. The array substrate can reduce the number of first transmission lines on the first flat portion 1241 and even do not arrange first transmission lines on the first flat portion 1241 by arranging at least one of the plurality of first transmission lines 140 on the side of the first edge portion 162 away from the display region 112 (i.e., the first slope portion 1243 or a side of the first slope portion 1243 away from the display region 112), so as to reduce a width of the first flat portion 1241, and further reduce a width of the peripheral region 114. Therefore, the array substrate is conducive to achieving narrow frame design or even frameless design of the display device adopting the array substrate.

For example, the display region can be a picture display region of the array substrate, that is, a light emitting region; the peripheral region can be a region where the array substrate does not display a picture, that is, a non-luminous region. The peripheral region may surround the display region or may be a part of the periphery of the display region.

For example, the base substrate 100 may be a flexible base substrate 100, such as polyimide (PI), to form a flexible display device. The material of the flexible substrate 100 is not limited to polyimide.

In some examples, as illustrated by FIGS. 3 and 4, the organic package layer 124 includes a second edge portion 1242 extending along the first direction, the second edge portion 1242 is located between the first edge portion 162 and the first barrier wall portion 132, and the orthographic projection of at least one of the plurality of first transmission lines 140 on the base substrate 110 is located within an orthographic projection of the second edge portion 1242 on the base substrate 110. Therefore, the array substrate can reduce the number of first transmission lines arranged on the first flat portion and even do not arrange the first transmission lines on the first flat portion by arranging at least one of the plurality of first transmission lines on the second edge portion, so as to reduce the width of the first flat portion and further reduce the width of the peripheral region.

In some examples, as illustrated by FIGS. 3 and 4, the plurality of first transmission lines 140 include a plurality of first flat transmission lines 142 located at a side of the first edge portion 162 away from the base substrate 110 and a plurality of first slope transmission lines 144 located at a side of the second edge portion 1242 away from the base substrate 110. Because the transmission lines in a common array substrate are all disposed at a side of the first edge portion away from the base substrate, i.e., disposed on the first flat portion, the width of the first flat portion in the second direction Y is relatively large. However, the first flat transmission lines are located at a side of the first edge portion 162 away from the base substrate and the first slope transmission lines are located at a side of the second edge portion away from the base substrate, such that the number of the first transmission lines which are disposed on the first flat portion is reduced, the width of the first flat portion in the second direction Y can be reduced, and the width of the periphery region of the array substrate in the second direction Y can be reduced. Therefore, the display device adopting the array substrate can have a relatively narrow frame.

In some examples, as illustrated by FIGS. 3 and 4, a distance between two adjacent ones of the plurality of first slope transmission lines 144 is larger than a distance between two adjacent ones of the plurality of first flat transmission lines 142. Because the first slope transmission lines are formed on a slope portion, in the process of patterning a conductive film layer to form the first flat transmission lines and the first slope transmission lines, upon the performance of the exposure machine being limited, it is easy to cause underexposure of the first slope transmission lines on the slope portion, which further leads to short circuit between two adjacent ones of the plurality of first slope transmission lines. In the array substrate provided in the present example, by setting the distance between two adjacent ones of the plurality of first slope transmission lines to be larger than the distance between two adjacent ones of the plurality of first flat transmission lines, the array substrate can avoid various defects such as short circuit caused by the underexposure of the first slope transmission lines.

In some examples, the distance between two adjacent ones of the plurality of first slope transmission lines 144 is 1.05-2 times of the distance between two adjacent ones of the plurality of first flat transmission lines 142. Therefore, the array substrate can avoid the exposure problem caused by forming the first slope transmission lines on the first slope portion, thereby avoiding various defects caused by the exposure problem.

For example, the distance between two adjacent ones of the plurality of first slope transmission lines 144 is 1.5 times of the distance between two adjacent ones of the plurality of first flat transmission lines 142. On the one hand, the array substrate can avoid the exposure problem caused by forming the first slope transmission lines on the first slope portion; on the other hand, the array substrate can also make the distance between two adjacent ones of the plurality of first slope transmission lines relatively small, so that more first slope transmission lines can be arranged on the first slope portion.

Of course, embodiments of the present disclosure include, but are not limited thereto, the distance between two adjacent ones of the plurality of first slope transmission lines may be equal to the distance between two adjacent ones of the plurality of first flat transmission lines. For example, the distance between two adjacent ones of the plurality of first slope transmission lines may be equal to the distance between two adjacent ones of the plurality of first flat transmission lines, but a line width of the first slope transmission lines is larger than that of the first flat transmission lines. In some examples, the distance between two adjacent ones of the plurality of first slope transmission lines 144 is 1.05-2 times of a width of each of the plurality of first slope transmission lines 144. Because the distance between two adjacent ones of the plurality of first slope transmission lines is set to be relatively large, the array substrate can avoid the exposure problem caused by forming the first slope transmission lines on the first slope portion, thereby avoiding various defects caused by the exposure problem.

In some examples, as illustrated by FIG. 3 and FIG. 4, one of the plurality of first transmission lines 140, which is furthest away from the display region 112, is a part of a ground line, and an orthographic projection of the first transmission line 140 which is furthest away from the display region 112 on the base substrate 110 is located between the orthographic projection of the organic package layer 124 on the base substrate 110 and the orthographic projection of the first barrier wall portion 132 on the base substrate 110. That is to say, the outermost one of the plurality of first transmission lines is a part of the ground line, and the ground line is disposed between the first barrier wall portion and the organic package layer. Therefore, the array substrate can also use the space between the first barrier wall and the organic package layer to set the ground line, thereby further reducing the number of transmission lines on the flat portion of the package layer and further reducing the width of the peripheral region of the array substrate.

In some examples, as illustrated by FIGS. 3 and 4, the array substrate 100 further includes a plurality of touch driving electrodes 182, a plurality of touch sensing electrodes 184, a touch driving signal line 186 and a touch sensing signal line 188; the plurality of touch driving electrodes 182 and the plurality of touch sensing electrodes 184 are located in the display region 112 and located at a side of the package layer 120 away from the base substrate 110; the touch driving signal line 186 is connected with the touch driving electrode 182 and extends to the peripheral region 114; the touch sensing signal line 188 is connected with the touch sensing electrode 184 and extends to the peripheral region 114. For example, both the touch driving signal line 186 and the touch sensing signal line 188 can extend to a bonding region 115 in the peripheral region 114, so as to be bonded with an external circuit, thereby achieving touch driving, data receiving and data processing. In the array substrate provided in the present example, at least some of the plurality of first transmission lines 140 are a part of the touch driving signal line 186 or the touch sensing signal line 188.

For example, the touch driving electrode and the touch sensing electrode can be transparent electrodes or metal mesh. A capacitor can be formed at the overlapping position of the touch driving electrode and the touch sensing electrode; upon a touch position being touched by a finger, the coupling of the capacitor near the touch point is affected, and the capacitance of the capacitor near the touch point is changed. Therefore, touch position can be judged by the change of the capacitance. Embodiments of the present disclosure are not limited thereto, for example, the touch layer may include a mutual capacitive touch structure or a self-capacitive touch structure.

Figure 5:
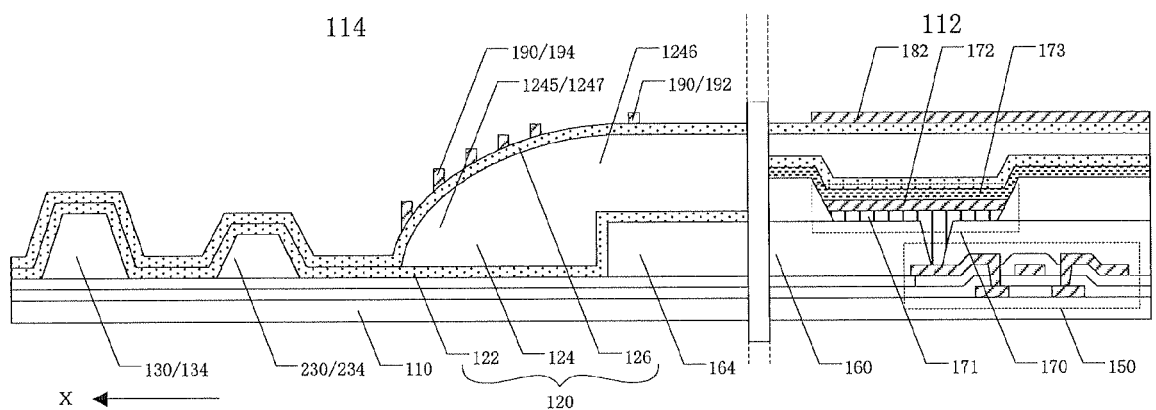
FIG. 5 is a schematic cross-sectional view of an array substrate according to an embodiment of the present disclosure along the BB direction in FIG. 3.

FIG. 5 is a schematic cross-sectional view of an array substrate according to an embodiment of the present disclosure along the BB direction in FIG. 3. As illustrated by FIGS. 3, 4 and 5, the first barrier wall 130 includes a second barrier wall portion 134 extending in the second direction. For example, the second barrier wall portion 134 is connected with the first barrier wall portion 132, and the two first barrier wall portions 132 and the two second barrier wall portions 134 are connected end to end to form a rectangular first barrier wall 130 surrounding the display region 112.

In some examples, as illustrated by FIG. 5, the array substrate 100 further includes a plurality of second transmission lines 190; each of the plurality of second transmission lines 190 extends in a second direction; the planarization layer 160 includes a third edge portion 164 extending along the second direction, the third edge portion 164 is located between the second barrier wall portion 134 and the display region 112, an orthographic projection of the third edge portion 164 on the base substrate 110 is covered by the orthographic projection of the organic package layer 124 on the base substrate 110, and the orthographic projection of at least one of the plurality of second transmission lines 190 on the base substrate 110 is located at a side of the third edge portion 164 away from display region 112. Because the planarization layer 160 is not arranged on the entire surface of the array substrate, a distance between the package layer 120 and the base substrate 110 will suddenly decrease at the third edge portion 164, and the organic package layer 124 will undergo a leveling process, thus forming a second slope portion 1247 with gradually decreasing thickness in the peripheral region 114, while a portion of the organic package layer 124 above the third edge portion 164 is a second flat portion 1246. The array substrate can reduce the number of the second transmission lines arranged on the second flat portion 1246 and even do not arrange the second transmission line on the second flat portion 1246 by arranging at least one of the plurality of second transmission lines 190 on a side of the third edge portion 164 away from the display region 112 (i.e., on the second slope portion 1247 or a side of the second slope portion 1247 away from the display region 112), so as to reduce the width of the second flat portion 1246, and further reduce the width of the peripheral region 114, such that the array substrate is conducive to achieving the narrow frame or even frameless design of the display device adopting the array substrate.

In some examples, as illustrated by FIGS. 3, 4 and 5, the array substrate 100 further includes a plurality of touch driving electrodes 182, a plurality of touch sensing electrodes 184, a touch driving signal line 186 and a touch sensing signal line 188; the plurality of touch driving electrodes 182 and the plurality of touch sensing electrodes 184 are located in the display region 112 and located at a side of the package layer 120 away from the base substrate 110. A touch driving signal line 186 is connected with the touch driving electrode 182 and extends to the peripheral region 114. A touch sensing signal line 188 is connected with the touch sensing electrode 184 and extends to the peripheral region 114. For example, both the touch driving signal line 186 and the touch sensing signal line 188 can extend to a bonding region 115 in the peripheral region 114, so as to be bonded with an external circuit, thereby achieving touch driving, data receiving and data processing. Each of the touch sensing electrodes 184 extends along a first direction, the plurality of touch sensing electrodes 184 are arranged along the second direction; and at least some of the plurality of first transmission lines 140 are a part of the touch sensing signal line 188. Each of the touch driving electrodes 182 extends along the second direction, the plurality of touch driving electrodes 182 are arranged along the first direction, and at least some of the plurality of second transmission lines 190 are a part of the touch driving signal line 186.

For example, as illustrated by FIGS. 3, 4 and 5, the touch driving signal line 186 includes a first portion 1861 extending along an extending direction of the touch driving electrodes 182, a second portion 1862 extending along an arrangement direction of the plurality of touch driving electrodes 182 and a third portion 1863 extending along the extending direction of the touch driving electrodes 182. The first portion 1861 is connected with the touch driving electrode 182, the second portion 1862 is connected with the first portion 1861, and the third portion 1863 is connected with the second portion 1862. In this case, the extending direction of each of the touch driving electrodes 182 is the first direction X, and the arrangement direction of the plurality of touch driving electrodes 182 is the second direction Y. Each of the first transmission lines 140 may be a third portion 1863 of the touch driving signal line 186.

For example, as illustrated by FIGS. 3, 4 and 5, the touch sensing signal line 188 includes a fourth portion 1881 extending along an extending direction of the touch sensing electrodes 184 and a fifth portion 1882 extending along the arrangement direction of the plurality of touch sensing electrodes 184; the fourth portion 1881 is connected with the touch sensing electrode 184, and the fifth portion 1882 is connected with the fourth portion 1881. In this case, the extending direction of each of the touch sensing electrodes 184 is the second direction Y, and the arrangement direction of the plurality of touch sensing electrodes 184 is the first direction X. Each of first transmission lines 140 may be the fifth portion 1882 of the touch sensing signal line 188. In this case, some of the first transmission lines 140 are a part of the touch driving signal line 186, and some of the first transmission lines 140 are a part of the touch sensing signal line 188.

In some examples, as illustrated by FIGS. 3, 4 and 5, the organic package layer 124 includes a fourth edge portion 1245 extending along the second direction, the fourth edge portion 1245 is located between the third edge portion 164 and the second barrier wall portion 134, and the orthographic projection of at least one of the plurality of second transmission lines 190 on the base substrate 110 is located within an orthographic projection of the fourth edge portion 1245 on the base substrate 110. The array substrate can reduce the number of second transmission lines arranged on the second flat portion 1246 and even do not arrange the second transmission lines on the second flat portion 1246 by setting the orthographic projection of at least one of the plurality of second transmission lines 190 on the base substrate 110 within the orthographic projection of the fourth edge portion 1245 on the base substrate 110 (i.e., setting at least one of the plurality of second transmission lines 190 on the fourth edge portion 1245), so as to reduce the width of the second flat portion 1246, and further reduce the width of the peripheral region 114. Therefore, the array substrate is conducive to achieving the narrow frame or even frameless design of the display device adopting the array substrate.

In some examples, as illustrated by FIGS. 3, 4, and 5, the plurality of second transmission lines 190 include a plurality of second flat transmission lines 192 located at a side of the third edge portion 164 away from the base substrate 110 and a plurality of second slope transmission lines 194 located at a side of the fourth edge portion 1245 away from the base substrate 110. Because the transmission lines in a common array substrate are all disposed at a side of the third edge portion away from the base substrate, i.e., disposed on the second flat portion, the width of the second flat portion in the first direction X is relatively large. However, the second flat transmission lines are located at a side of the third edge portion away from the base substrate and the second slope transmission lines are located at a side of the fourth edge portion away from the base substrate, such that the number of the second transmission lines which are disposed on the second flat portion is reduced, and the width of the second flat portion in the first direction X can be reduced, and the width of the peripheral region of the array substrate in the first direction X can be further reduced. Therefore, the display device adopting the array substrate can have a relatively narrow frame.

In some examples, as illustrated by FIGS. 3 and 5, a distance between two adjacent ones of the plurality of second slope transmission lines 194 is larger than a distance between two adjacent ones of the plurality of second flat transmission lines 192. Because the second slope transmission lines are formed on the slope portion, in the process of patterning the conductive film layer to form the abovementioned second flat transmission lines and the second slope transmission lines, upon the performance of the exposure machine being limited, it is easy to cause underexposure of the second slope transmission lines on the slope portion, resulting in short circuit and other undesirable phenomena between two adjacent ones of the plurality of second slope transmission lines. In the array substrate provided in the present example, by setting the distance between two adjacent ones of the plurality of second slope transmission lines to be larger than the distance between two adjacent second ones of the plurality of flat transmission lines, the array substrate can avoid various defects such as short circuit caused by underexposure of the second slope transmission lines.

In some examples, the distance between two adjacent ones of the plurality of second slope transmission lines 194 is 1.05-2 times of the distance between two adjacent ones of the plurality of second flat transmission lines 192. Therefore, the array substrate can avoid the exposure problem caused by forming the second slope transmission lines on the second slope portion, thereby avoiding various defects caused by the exposure problem.

For example, the distance between two adjacent ones of the plurality of second slope transmission lines 194 is 1.5 times the distance between two adjacent ones of the plurality of second flat transmission lines 192. On one hand, the array substrate can avoid the exposure problem caused by forming the second slope transmission lines on the second slope portion; on the other hand, the array substrate can also make the distance between two adjacent ones of the plurality of second slope transmission lines smaller at the same time, so that more second slope transmission lines can be arranged on the second slope portion.

In some examples, among the plurality of second slope transmission lines 194, the distance between two adjacent ones of the plurality of second slope transmission lines 194 is 1.05-2 times of a width of the second slope transmission lines 194. Because the distance between two adjacent ones of the plurality of second slope transmission lines is set to be larger, the array substrate can avoid the exposure problem caused by forming the second slope transmission lines on the second slope portion, thereby avoiding various defects caused by the exposure problem.

In some examples, as illustrated by FIGS. 3, 4, and 5, the organic light emitting element 170 includes an anode 171, a light emitting layer 172, and a cathode 173 sequentially stacked in a direction away from the base substrate 110. Therefore, the organic light emitting element 170 can emit light through the light emitting layer 172.

In some examples, as illustrated by FIGS. 3, 4 and 5, the package layer 120 further includes a first inorganic package layer 122 and a second inorganic package layer 126; the first inorganic package layer 122 is disposed on a side of the organic light emitting element 170 away from the base substrate 110, and the second inorganic package layer 126 is disposed on a side of the first inorganic package layer 122 away from the base substrate 110; the organic package layer 124 is sandwiched between the first inorganic package layer 122 and the second inorganic package layer 124, and the plurality of first transmission lines 140 are located at a side of the second inorganic package layer 126 away from the base substrate 110. Therefore, the package layer has a strong ability to isolate water and oxygen, thus effectively preventing the corrosion of elements packaged by the package layer by water and oxygen in the external environment.

For example, the material of the first inorganic package layer and the second inorganic package layer can be selected from one or more from the group consisting of silicon oxide, silicon nitride and silicon oxynitride. Because of the high density of inorganic materials, it is possible to prevent water, oxygen, etc., from invading and affecting the performance of light emitting element. The material of the abovementioned organic package layer can include polymer resin, such as polyimide, polyacrylate, etc., and the organic package layer plays a role of flattening, relieving stress, etc.

In some examples, as illustrated by FIGS. 3 and 4, in the peripheral region 114, the first inorganic package layer 122 includes a first inorganic package portion 1221, a second inorganic package portion 1222 and an inorganic package connection portion 1223 connecting the first inorganic package portion 1221 and the second inorganic package portion 1222. An orthographic projection of the first inorganic package portion 1221 on the base substrate 110 is overlapped with an orthographic projection of the first edge portion 162 on the base substrate 110. That is, the first inorganic package portion 1221 is disposed on the first edge portion 162, and the second inorganic package portion 1222 is disposed on the base substrate 110, and is located at a side of the first edge portion 162 away from the display region 112.

The organic package layer 124 includes a first organic package portion 1248 and a second organic package portion 1249 which are continuously disposed, an edge of the second organic package portion 1249 away from the display region 112 is an edge of the organic package layer 124, an orthographic projection of the first organic package portion 1248 on the base substrate 110 is overlapped with orthographic projections of the first inorganic package portion 1221 and the inorganic package connection portion 1223 on the base substrate 110, an orthographic projection of the second organic package portion 1249 on the base substrate 110 is overlapped with the orthographic projection of the second inorganic package portion 1222 on the base substrate 110. In a direction perpendicular to the base substrate 110, a distance d1 between the first inorganic package portion 1221 and the base substrate 110 is larger than a distance d2 between the second inorganic package portion 1222 and the base substrate 110, and a difference between d1 and d2 is greater than or equal to the thickness of the planarization layer 160, the orthographic projection of at least one of the plurality of first transmission lines 140 on the base substrate 110 falls into the orthographic projection of the second inorganic package portion 1222 on the base substrate 110.

In the array substrate provided by the embodiments of the present disclosure, because the distance d1 between the first inorganic package portion 1221 and the base substrate 110 is larger than a distance d2 between the second inorganic package portion 1222 and the base substrate 110, and a difference between d1 and d2 is greater than or equal to the thickness of the planarization layer 160, the organic package layer 124 formed on the first inorganic package layer 122 will form a slope portion with gradually decreasing thickness at the position of the second inorganic package portion 1222; that is, the second organic package portion 1249 is a slope portion, and the first organic package portion 1248 is a flat portion. The array substrate can reduce the number of first transmission lines arranged on the flat portion of the organic package layer 124 and even do not arrange the first transmission lines on the organic package layer 124 by arranging the orthographic projection of at least one of the plurality of first transmission lines 140 on the base substrate 110 into the orthographic projection of the second inorganic package portion 1222 on the base substrate 110 (i.e., the second organic package portion 1249 or a side of the second organic package portion 1249 away from the display region 112), so as to reduce the width of the organic package layer 124, and further reduce the width of the peripheral region 114. The array substrate is conducive to achieving the narrow frame or even frameless design of the display device adopting the array substrate.

In some examples, as illustrated by FIGS. 3, 4 and 5, the array substrate 100 further includes a second barrier wall 230; the second barrier wall 230 is disposed on the base substrate 110 and located in the peripheral region 114. The second barrier wall 230 is located between the first barrier wall 130 and the display region 112, the second barrier wall 230 includes a third barrier wall portion 232 extending along the first direction, the orthographic projection of the first transmission lines 140 on the base substrate 110 is located at a side of the orthographic projection of the third barrier wall portion 232 on the base substrate 110 close to the display region 112. Of course, embodiments of the present disclosure include but are not limited thereto.

In some examples, as illustrated by FIGS. 3, 4 and 5, the second edge portion 1242 of the organic package layer 124 may be located at a side of the second barrier wall 230 close to the display region 112; in this case, the orthographic projection of the first transmission lines 140 on the second edge portion on the base substrate 110 is located at a side of the orthographic projection of the third barrier wall portion 232 on the base substrate 110 close to the display region 112. Of course, the present disclosure includes but is not limited thereto, and the second edge portion of the organic package layer may also extend beyond the second barrier wall and be located between the second barrier wall and the first barrier wall; in this case, the first transmission line located on the second edge portion may also be located on the second barrier wall or between the second barrier wall and the first barrier wall.

In some examples, the pixel driving layer may include elements such as thin film transistors. For example, the pixel driving layer may include an active layer on the base substrate, a first gate insulating layer at a side of the active layer away from the base substrate, a gate electrode at a side of the first gate insulating layer away from the active layer, a second gate insulating layer at a side of the gate electrode away from the first gate insulating layer, and a source electrode and a drain electrode at a side of the second gate insulating layer away from the gate electrode. The active layer may include a source region, a channel region, and a drain region. An orthographic projection of the gate electrode on the base substrate is at least partially overlapped with an orthographic projection of the channel region on the base substrate; the source electrode is in contact with the source region of the active layer, and the drain electrode is in contact with the drain region of the active layer. Of course, the specific pixel structure in the pixel driving layer can refer to the existing design, such as 2T1C structure, 7T1C and other pixel driving structures.

For example, the base substrate can be a glass substrate, a polyimide substrate or other substrates.

For example, the material of the first gate insulating layer and the second gate insulating layer may be at least one selected from the group consisting of silicon oxide, silicon nitride and silicon oxynitride.

Figure 6:
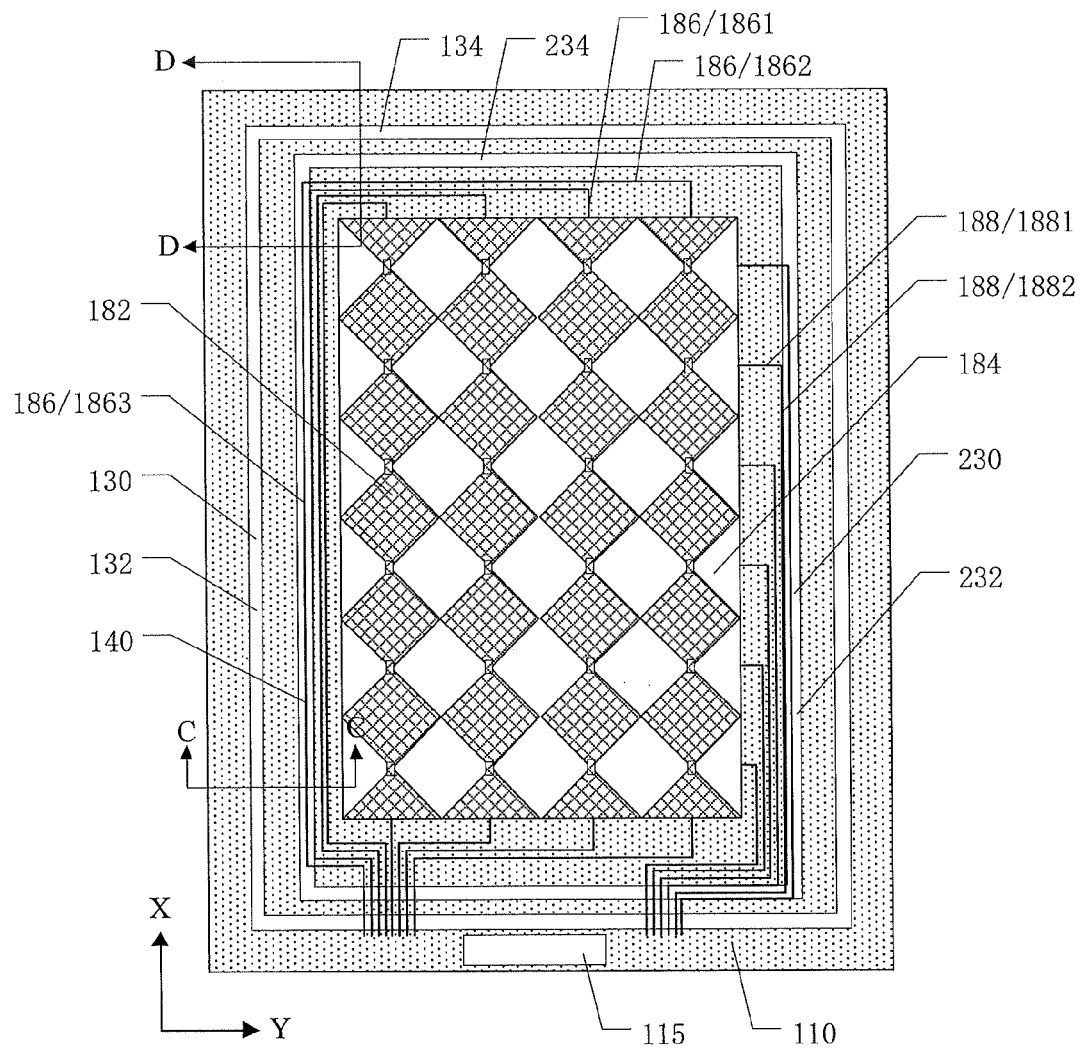
FIG. 6 is a schematic plan view of another array substrate according to an embodiment of the present disclosure.
Figure 7:
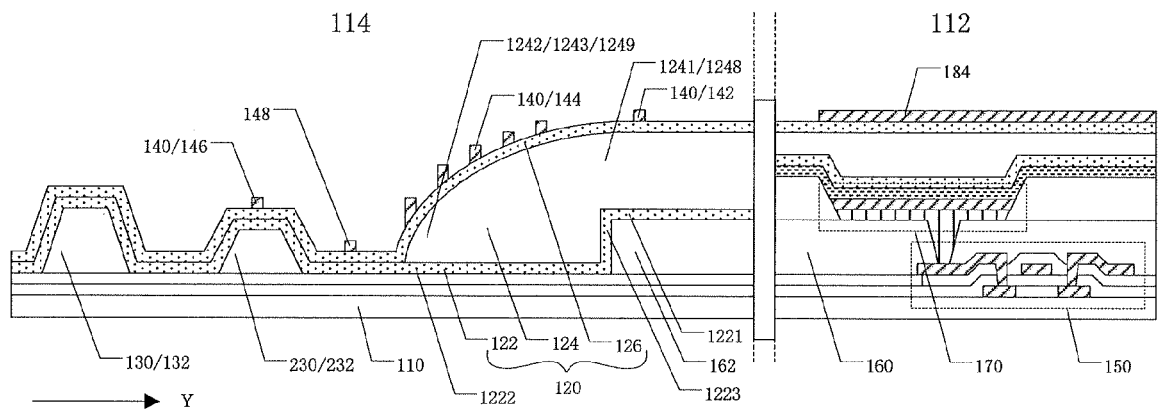
FIG. 7 is a schematic cross-sectional view of an array substrate according to an embodiment of the present disclosure along the CC direction in FIG. 6.

For example, the first inorganic package layer 122 and the second inorganic package layer 126 cover the first barrier wall 130 and the second barrier wall 230, thereby further enhancing the ability of isolating water and oxygen of the package layer. FIG. 6 is a schematic plan view of another array substrate according to an embodiment of the present disclosure. FIG. 7 is a schematic cross-sectional view of an array substrate provided according to an embodiment of the present disclosure along the CC direction in FIG. 6. As illustrated by FIGS. 6 and 7, the array substrate 100 further includes a second barrier wall 230; the second barrier wall 230 is disposed on the base substrate 110 and located in the peripheral region 114. The second barrier wall 230 is located between the first barrier wall 130 and the display region 112, the second barrier wall 230 includes a third barrier wall portion 232 extending along the first direction, the orthographic projection of at least one of the first transmission lines 140 on the base substrate 110 is located within the orthographic projection of the third barrier wall portion 232 on the base substrate 110. That is, at least one of the plurality of first transmission lines 140 is disposed on the third barrier wall portion 232. In this case, by arranging at least one of the first transmission lines on the third barrier wall, the array substrate can further reduce the width of the peripheral region, thereby further reducing the frame width of the display device adopting the array substrate, thereby achieving the narrow frame design.

It should be noted that, upon the at least one of the first transmission lines being arranged on the third barrier wall, the first inorganic package layer and the second inorganic package layer of the package layer can be arranged on a side of the third barrier wall away from the base substrate, while the first transmission line arranged on the third barrier wall can be arranged on a side of the second inorganic package layer away from the base substrate.

In some examples, as illustrated by FIG. 7, the plurality of first transmission lines 140 include a plurality of first barrier wall transmission lines 146 located on the third barrier portion 232. That is, the orthographic projection of the plurality of first barrier wall transmission lines 146 on the base substrate 110 falls into the orthographic projection of the third barrier wall portion 232 on the base substrate 110. Thus, in a common design, because the plurality of first transmission lines are disposed on the first flat portion, the width of the first flat portion in the second direction Y is relatively larger. However, in the array substrate provided by the embodiments of the present disclosure, the first flat transmission lines are formed on the first flat portion, the first slope transmission lines are formed on the first slope portion, and the first barrier wall transmission lines are formed on the third barrier wall portion, such that the number of the first transmission lines which need to be disposed on the first flat portion is largely reduced, the width of the first flat portion in the second direction Y is reduced, and the width of the peripheral region of the array substrate in the second direction Y is further reduced. Therefore, the display device adopting the array substrate can have a relatively narrow frame.

Figure 8:
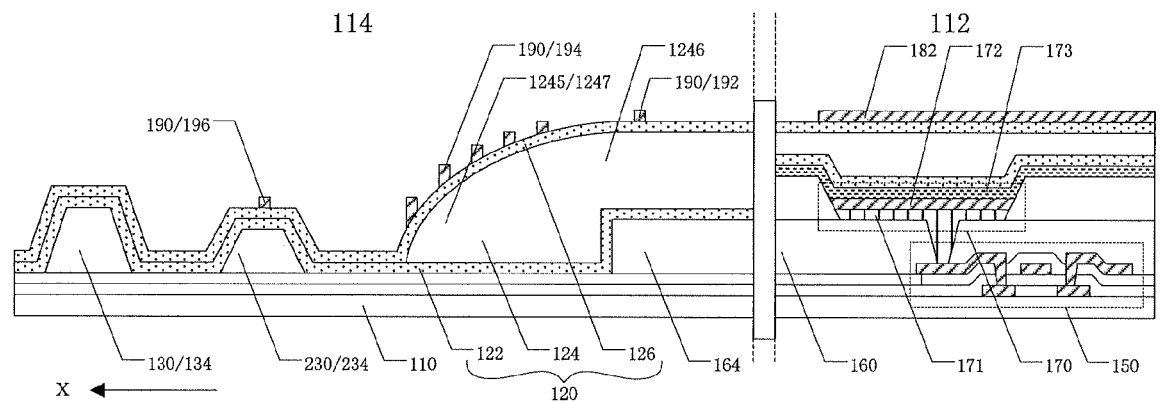
FIG. 8 is a schematic cross-sectional view of an array substrate according to an embodiment of the present disclosure along the DD direction in FIG. 6.

FIG. 8 is a schematic cross-sectional view of an array substrate according to an embodiment of the present disclosure along the DD direction in FIG. 6. As illustrated by FIG. 8, the second barrier wall 230 includes a fourth barrier wall portion 234 extending along the second direction, and the orthographic projection of at least one of the plurality of second transmission lines 190 on the base substrate 110 falls within the orthographic projection of the fourth barrier wall portion 234 on the base substrate 110. That is, at least one of the plurality of second transmission lines 190 is disposed on the fourth barrier wall portion 234. In this case, by arranging at least one of the plurality of second transmission lines 190 on the fourth barrier wall, the array substrate can further reduce the width of the peripheral region, thereby further reducing the frame width of the display device adopting the array substrate, thereby achieving a narrow frame design.

In some examples, as illustrated by FIG. 8, the plurality of second transmission lines 190 include a plurality of second barrier wall transmission lines 196 located on the fourth barrier portion 234. That is, the orthographic projection of the plurality of second barrier wall transmission lines 196 on the base substrate 110 falls into the orthographic projection of the fourth barrier wall portion 234 on the base substrate 110. Therefore, in the array substrate provided by the embodiment of the present disclosure, the second flat transmission lines are formed on the second flat portion, the second slope transmission lines are formed on the second slope portion, and the second barrier wall transmission lines are formed on the fourth barrier wall portion, so that the number of second transmission lines that need to be disposed on the second flat portion is greatly reduced, thereby reducing the width of the second flat portion in the first direction X and further reducing the width of the peripheral region of the array substrate in the first direction X. Therefore, the display device adopting the array substrate can have a narrow frame.

Figure 9:
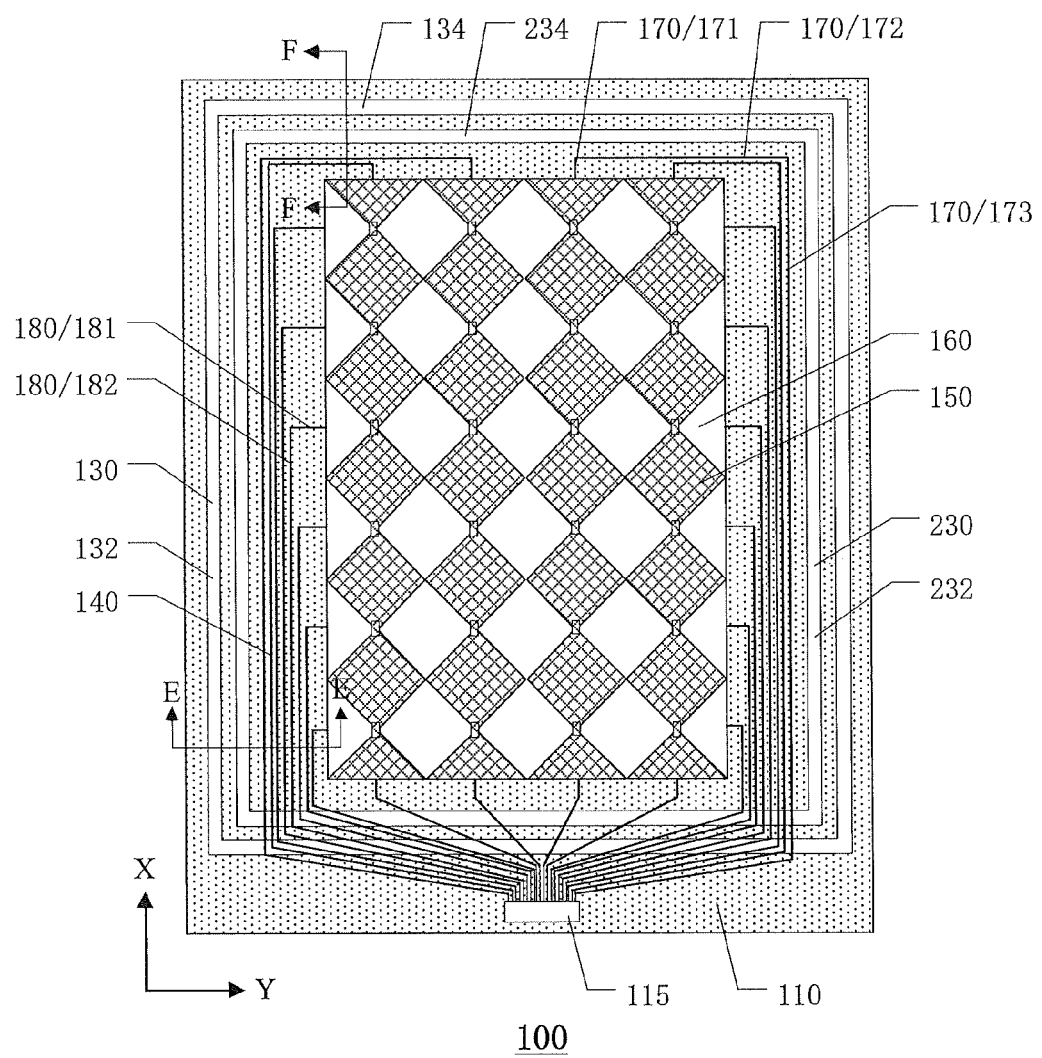
FIG. 9 is a schematic plan view of an array substrate according to an embodiment of the present disclosure.
Figure 10:
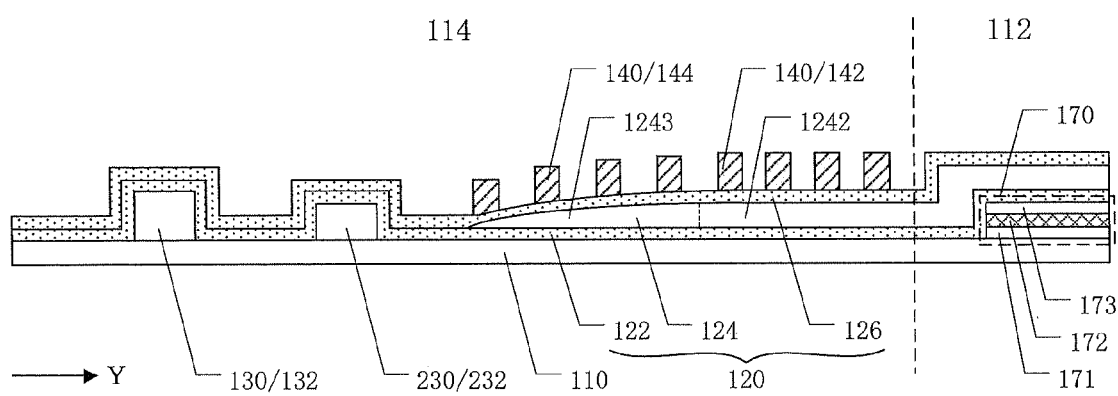
FIG. 10 is a schematic cross-sectional view of an array substrate according to an embodiment of the present disclosure along the EE direction in FIG. 9.

Another embodiment of the present disclosure also provides an array substrate. FIG. 9 is a schematic plan view of an array substrate according to an embodiment of the present disclosure; FIG. 10 is a schematic cross-sectional view of an array substrate according to an embodiment of the present disclosure along the EE direction in FIG. 9. As illustrated by FIGS. 9 and 10, the array substrate 100 includes a base substrate 110, a package layer 120, a first barrier wall 130 and a plurality of first transmission lines 140. The base substrate 110 includes a display region 112 and a peripheral region 114 located around the display region 112, in this case, the array substrate 100 can also be divided by the display region 112 and the peripheral region 114. The package layer 120 is disposed on the base substrate 110, for example, the package layer 120 may be directly disposed on the base substrate 110 in some regions, or other film structures, such as a light emitting structure and a circuit structure that drives the light emitting structure to emit light, may be disposed between the package layer 120 and the base substrate 110. The package layer 120 can package the light emitting structure and the circuit structure formed on the base substrate 110 and prevent the water and oxygen in the external environment from corroding the light emitting structure and the circuit structure. The first barrier wall 130 is disposed on the base substrate 110 and located in the peripheral region 114, the first barrier wall 130 can block the fluid material in the package layer 120 from flowing out of the first barrier wall 130 during the formation of the package layer 120. The plurality of first transmission lines 140 are located in the peripheral region 114 and located at a side of the package layer 120 away from the base substrate 110.

As illustrated by FIGS. 9 and 10, each of the plurality of first transmission lines 140 extends along the first direction X, and the plurality of first transmission lines 140 are arranged along the second direction Y; the first barrier wall 130 includes a first barrier wall portion 132 extending along the first direction X. The package layer 120 includes an organic package layer 124, and an edge portion of the organic package layer 124 extending along the first direction X is located between the first barrier portion 132 and the display region 112, and the edge portion includes a first flat portion 1241 and a first slope portion 1243, the plurality of first transmission lines 140 are at least partially located on the first slope portion 1243. It should be noted that the gradient of the first flat portion is less than 1/50, and the gradient of the first slope portion is greater than 1/50, and the expression that the plurality of first transmission lines 140 are at least partially located on the first slope portion refers to that the orthographic projection of the plurality of first transmission lines on the base substrate is at least partially overlapped with the orthographic projection of the first slope portion on the base substrate.

In the array substrate provided by the embodiment of the present disclosure, because the organic package layer undergoes a leveling process, the first slope portion with gradually decreased thickness is formed in the peripheral region. According to the array substrate, the plurality of first transmission lines are at least partially arranged on the first slope portion, so that the width of the peripheral region can be reduced, and the frame width of a display device adopting the array substrate can be reduced, thereby achieving a narrow frame design.

In some example, as illustrated by FIG. 9 and FIG. 10, the organic package layer 124 includes a second edge portion 1242 extending along the first direction, i.e., the abovementioned first slope portion 1243, the second edge portion 1242 is located between the first edge portion 162 and the first barrier wall 132, and the orthographic projection of at least one of the plurality of first transmission lines 140 on the base substrate 110 is located with the orthographic projection of the second edge portion 1242 on the base substrate 110. Therefore, the array substrate can reduce the number of first transmission lines arranged on the first flat portion and even do not arrange the first transmission lines on the first flat portion by at least partially arranging a plurality of first transmission lines on the second edge portion, so as to reduce the width of the first flat portion, and further reduce the width of the peripheral region.

In some examples, as illustrated by FIGS. 9 and 10, the plurality of first transmission lines 140 include a plurality of first flat transmission lines 142 on the first flat portion 1241 and a plurality of first slope transmission lines 144 on the first slope portion 1243. That is to say, the orthographic projection of the first flat transmission lines 142 on the base substrate 110 falls into the orthographic projection of the first flat portions 1241 on the base substrate 110, and the orthographic projection of the first slope transmission lines 144 on the base substrate 110 falls into the orthographic projection of the first slope portions 1243 on the base substrate 110. Therefore, in a common design, because the plurality of first transmission lines are all arranged on the first flat portion, the width of the first flat portion in the second direction Y is relatively large; however, in the array substrate provided by the embodiments of the present disclosure, the first flat transmission lines are formed on the first flat portion, and the first slope transmission lines are formed on the first slope portion, so that the number of first transmission lines that need to be disposed on the first flat portion is reduced, thereby reducing the width of the first flat portion in the second direction Y, and further reducing the width of the peripheral region of the array substrate in the second direction Y. Therefore, the display device adopting the array substrate can have a narrow frame.

In some examples, as illustrated by FIGS. 9 and 10, a distance between two adjacent ones of the plurality of first slope transmission lines 144 is larger than a distance between two adjacent ones of the plurality of first flat transmission lines 142. Because the first slope transmission lines are formed on the slope portion, in the process of patterning a conductive film layer to form the first flat transmission lines and the first slope transmission lines, upon the performance of the exposure machine being limited, it is easy to cause underexposure of the first slope transmission line on the slope, which leads to short circuit between two adjacent ones of the plurality of first slope transmission lines. In the array substrate provided in the present example, by setting the distance between two adjacent ones of the plurality of first slope transmission lines to be larger than the distance between two adjacent ones of the plurality of first flat transmission lines, the array substrate can avoid various defects such as short circuit caused by underexposure of the first slope transmission lines.

In some examples, the distance between two adjacent ones of the plurality of first slope transmission lines 144 is 1.05-2 times of the distance between two adjacent ones of the plurality of first flat transmission lines 142. Therefore, the array substrate can avoid the exposure problem caused by forming the first slope transmission line on the first slope portion, thereby avoiding various, defects caused by the exposure problem.

In some examples, as illustrated by FIGS. 9 and 10, the distance between two adjacent ones of the plurality of first slope transmission lines 144 is greater than or equal to 1.5 times of the distance between two adjacent ones of the plurality of first flat transmission lines 142. By setting the distance between two adjacent ones of the plurality of first slope transmission lines to be greater than or equal to 1.5 times of the distance between two adjacent ones of the plurality of first flat transmission lines, the array substrate can avoid the exposure problem caused by forming the first slope transmission lines on the first slope portion, thereby avoiding various defects caused by exposure problems.

For example, because the first slope transmission lines are fainted on the first slope portion, in the process of patterning the conductive film layer to form the first flat transmission lines and the first slope transmission lines, upon the performance of the exposure machine being limited, it is easy to cause underexposure of the first slope transmission line, thus causing short circuit between two adjacent ones of the plurality of first slope transmission lines. In the array substrate provided in the present example, by setting the distance between two adjacent ones of the plurality of first slope transmission lines to be greater than or equal to 1.5 times of the distance between two adjacent ones of the plurality of first flat transmission lines, the array substrate can avoid short circuit caused by underexposure of the first slope transmission lines.

In some examples, among the plurality of first slope transmission lines 144, the distance between two adjacent ones of the plurality of first slope transmission lines 144 is 1.05-2 times of a width of the first slope transmission line 144. Because the distance between two adjacent ones of the plurality of first slope transmission lines is set to be relatively large, the array substrate can avoid the exposure problem caused by forming the first slope transmission lines on the first slope portion, thereby avoiding various defects caused by the exposure problem.

In some examples, as illustrated by FIGS. 9 and 10, among a plurality of first slope transmission lines, the distance between two adjacent ones of the plurality of first slope transmission lines 144 is 1.5 times of a width (i.e., line width) of the first slope transmission line 144. The array substrate can avoid the exposure problem caused by forming the first slope transmission lines on the first slope portion by setting the distance between two adjacent first slope transmission lines to be relatively large, thereby avoiding various defects caused by the exposure problem.

In some examples, as illustrated by FIGS. 9 and 10, the first slope portion 1243 and the first flat portion 1241 are continuously arranged along the second direction Y, and the first slope portion 1243 is located at a side of the first flat portion 1241 close to the first barrier wall portion 132. That is, the first slope portion and the first flat portion are two continuous parts of the first edge portion extending along the first direction X formed by the leveling process of the organic package layer.

In some examples, as illustrated by FIGS. 9 and 10, the first transmission line 140 among the plurality of first transmission lines 140, which is farthest from the display region 112, is located at an edge of the first slope portion 1243 away from the display region 112. That is to say, all the positions above the first slope portion 1243 are used to arrange the first transmission lines 140 (i.e., the first slope transmission lines 144), so that the width of the peripheral region of the array substrate can be greatly reduced, which is more conducive to achieving the narrow frame design.

In some examples, as illustrated by FIG. 10, the package layer 120 further includes a first inorganic package layer 122 and a second inorganic package layer 126; the first inorganic package layer 122 is disposed on the base substrate 110, and the second inorganic package layer 126 is disposed on a side of the first inorganic package layer 122 away from the base substrate 110; the organic package layer 124 is sandwiched between the first inorganic package layer 122 and the second inorganic package layer 124. Therefore, the package layer has a strong ability to isolate water and oxygen, thus effectively preventing corrosion of elements packaged by the package layer by water and oxygen in the external environment.

For example, the material of the first inorganic package layer and the second inorganic package layer can be selected from one or more selected from the group consisting of silicon oxide, silicon nitride or silicon oxynitride. The material of the organic package layer can be organic resin.

In some examples, as illustrated by FIGS. 9 and 10, the array substrate 100 further includes a plurality of touch driving electrodes 182, a plurality of touch sensing electrodes 184, a touch driving signal line 186 and a touch sensing signal line 188. The plurality of touch driving electrodes 182 and the plurality of touch sensing electrodes 184 are located in the display region 112 and located at a side of the package layer 120 away from the base substrate 110, the touch driving signal line 186 is connected with the touch driving electrode 182 and extends to the peripheral region 114, the touch sensing signal line 188 is connected with the touch sensing electrode 184 and extends to the peripheral region 114. For example, both the touch driving signal line 186 and the touch sensing signal line 188 can extend to a bonding region 115 in the peripheral region 114, so as to be bonded with an external circuit, thereby achieving touch driving, data receiving and data processing. In the array substrate provided in the present example, each of the first transmission lines 140 is a part of the touch driving signal line 186 or the touch sensing signal line 188.

For example, as illustrated by FIGS. 9 and 10, the touch driving signal line 186 includes a first portion 1861 extending along the extending direction of the touch driving electrodes 182, a second portion 1862 extending along the arrangement direction of the plurality of touch driving electrodes 182 and a third portion 1863 extending along the extending direction of the touch driving electrodes 182; the first portion 1861 is connected with the touch driving electrode 182, the second portion 1862 is connected with the first portion 1861, and the third portion 1863 is connected with the second portion 1862. In this case, the extending direction of each of the plurality of touch driving electrodes 182 is the first direction X, and the arrangement direction of the plurality of touch driving electrodes 182 is the second direction Y Each of the first transmission lines 140 may be a third portion 1863 of the touch driving signal line 186.

For example, as illustrated by FIGS. 9 and 10, the touch sensing signal line 188 includes a fourth portion 1881 extending along the extending direction of the touch sensing electrodes 184 and a fifth portion 1882 extending along the arrangement direction of the plurality of touch sensing electrodes 184; the fourth portion 1881 is connected with the touch sensing electrode 184, and the fifth portion 1882 is connected with the fourth portion 1881. In this case, the extending direction of each of the touch sensing electrodes 184 is the second direction Y, and the arrangement direction of the plurality of touch sensing electrodes 184 is the first direction X. Each of the first transmission lines 140 may be the fifth portion 1882 of the touch sensing signal line 188. In this case, some of the first transmission lines 140 are a part of the touch driving signal line 186, and some of the first transmission line 140 are a part of the touch sensing signal line 188.

Figure 11:
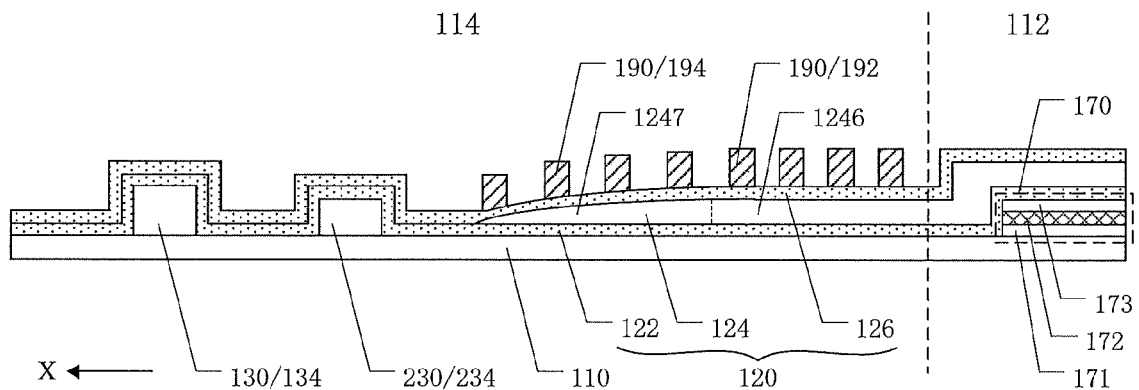
FIG. 11 is a schematic cross-sectional view of an array substrate according to an embodiment of the present disclosure along the FF direction in FIG. 9.

FIG. 11 is a schematic cross-sectional view of an array substrate according to an embodiment of the present disclosure along the FF direction in FIG. 9. As illustrated by FIGS. 9, 10 and 11, the first barrier wall 130 includes a second barrier wall portion 134 extending in the second direction. For example, the second barrier wall portion 134 is connected with the first barrier wall portion 132, and the two first barrier wall portions 132 and the two second barrier wall portions 134 are connected end to end to form a rectangular first barrier wall 134 surrounding the display region 112.

In some examples, as illustrated by FIG. 11, the array substrate 100 further includes a plurality of second transmission lines 190; each of the second transmission lines 190 extends in a second direction; an edge portion of the organic package layer 124 extending in the second direction is located between the second barrier wall 134 and the display region 112. The edge portion includes a second flat portion 1246 and a second slope portion 1247, and a plurality of second transmission lines 190 are at least partially located on the second slope portion 1247. That is, an orthographic projection of the plurality of second transmission lines 190 on the base substrate 110 is at least partially overlapped with an orthographic projection of the second slope portion 1247 on the base substrate 110. In the array substrate provided by the present example, because the organic package layer will undergo a leveling process, the abovementioned second slope portion will be formed in the peripheral region. By arranging a plurality of second transmission lines at least partially on the second slope portion, the array substrate can reduce the width of the peripheral region in the first direction, thereby reducing the frame width of a display device adopting the array substrate, thereby achieving a narrow frame design.

In some examples, as illustrated by FIG. 11, the plurality of second transmission lines 190 include a plurality of second flat transmission lines 192 on the second flat portion 1246 and a plurality of second slope transmission lines 194 on the second slope portion 1247. That is to say, an orthographic projection of the second flat transmission lines 192 on the base substrate 110 falls into an orthographic projection of the second flat portion 1246 on the base substrate 110, and an orthographic projection of the second slope transmission lines 194 on the base substrate 110 falls into the orthographic projection of the second slope portion 1247 on the base substrate 110. Therefore, in a common design, because the plurality of second transmission lines are all arranged on the second flat portion, the width of the second flat portion in the first direction X is relatively large; however, in the array substrate provided by the present example, the second flat transmission lines are formed on the second flat portion, and the second slope transmission lines are formed on the second slope portion, so that the number of second transmission lines that need to be disposed on the second flat portion is reduced, and thus the width of the second flat portion in the first direction can be reduced. Therefore, the display device adopting the array substrate can have a narrow frame.

In some examples, as illustrated by FIG. 11, a distance between two adjacent ones of the plurality of second slope transmission lines 194 is greater than or equal to 1.5 times of a distance between two adjacent ones of the plurality of second flat transmission lines 192. By setting the distance between two adjacent ones of the plurality of second slope transmission lines to be greater than or equal to 1.5 times of the distance between two adjacent ones of the plurality of second flat transmission lines, the array substrate can avoid the exposure problem caused by forming the second slope transmission lines on the second slope portion, thus avoiding various defects caused by exposure problems.

For example, because the second slope transmission lines are formed on the second slope portion, in the process of patterning a conductive film layer to form the abovementioned second flat transmission lines and second slope transmission lines, upon the performance of the exposure machine being limited, it is easy to cause underexposure of the second slope transmission lines, thereby causing short circuit between two adjacent ones of the plurality of second slope transmission lines. In the array substrate provided in the present example, by setting the distance between two adjacent ones of the plurality of second slope transmission lines to be greater than or equal to 1.5 times of the distance between two adjacent ones of the plurality of second flat transmission lines, the array substrate can avoid short circuit caused by underexposure of the second slope transmission lines.

In some examples, as illustrated by FIG. 11, the distance between two adjacent ones of the plurality of second slope transmission lines 194 is 1.5 times of the width (i.e., line width) of the second slope transmission lines 194.

In some examples, as illustrated by FIG. 11, the second slope portion 1247 and the second flat portion 1246 are continuously arranged along the first direction X, and the second slope portion 1247 is located at a side of the second flat portion 1246 close to the second barrier wall portion 134. That is, the second slope portion and the second flat portion are two continuous parts of the second edge portion extending along the second direction formed by a leveling process of the organic package layer.

In some examples, as illustrated by FIG. 11, the second transmission line 190 among the plurality of second transmission lines 190, which is farthest from the display region 112, is located at an edge of the second slope portion 1247 away from the display region 112. That is to say, all the positions above the second slope portion 1247 are used to set the abovementioned second transmission lines 190 (i.e., the second slope transmission lines 194), so that the width of the peripheral region of the array substrate can be greatly reduced, which is more conducive to achieving the narrow frame design.

In some examples, as illustrated by FIGS. 9 and 11, the touch driving signal line 186 includes a first portion 1861 extending along the extending direction of the touch driving electrodes 182, a second portion 1862 extending along the arrangement direction of the plurality of touch driving electrodes 182 and a third portion 173 extending along the extending direction of the touch driving electrodes 182; the first portion 1861 is connected with the touch driving electrode 182, the second portion 1862 is connected with the first portion 1861, and the third portion 1863 is connected with the second portion 1862. In this case, the extending direction of each of the plurality of touch driving electrodes 182 is the first direction X, and the arrangement direction of the plurality of touch driving electrodes 182 is the second direction Y. The second transmission line 190 may be the second portion 1862 of the touch driving signal line 186.

It should be noted that, in the array substrates shown in FIGS. 9, 10 and 11, the extending direction of the first transmission line is the extending direction of the touch driving signal line, and the extending direction of the second transmission line is the extending direction of the touch sensing signal line. However, the abovementioned FIGS. 9, 10 and 11 are only one example of the array substrate provided by the embodiments of the present disclosure, which includes but is not limited thereto. The extending direction of the first transmission line (i.e., the first direction) can also be the extending direction of the touch sensing signal line, and the extending direction of the second transmission line (i.e., the second direction) can also be the extending direction of the touch driving signal line. In addition, the array substrate may only include the first transmission line without the second transmission line.

In some examples, as illustrated by FIGS. 10 and 11, the array substrate 100 further includes an organic light emitting structure 170; the organic light emitting element 170 is located in the display region 112 and between the package layer 120 and the base substrate 110. In this case, the package layer 120 can be used to package the organic light emitting element 170, so as to prevent the water and oxygen of the external environment from corroding the organic light emitting element 170.

For example, the organic light emitting element 170 may include an anode 171, an organic light emitting layer 172, and a cathode 173. Of course, the organic light emitting element 170 may also include other functional layers, such as hole transport layer, electron transport layer, etc., and the embodiments of the present disclosure will not be described in detail here.

Figure 12:
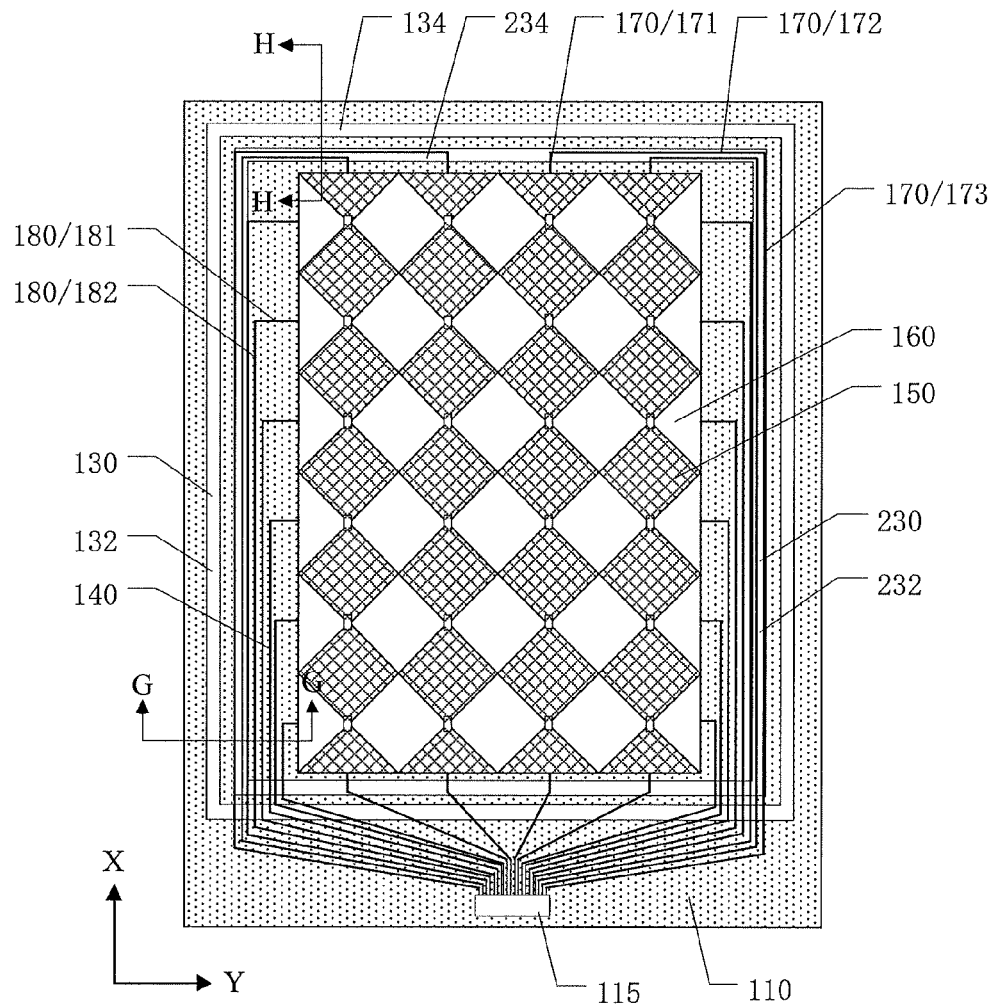
FIG. 12 is a schematic plan view of another array substrate according to an embodiment of the present disclosure.
Figure 13:
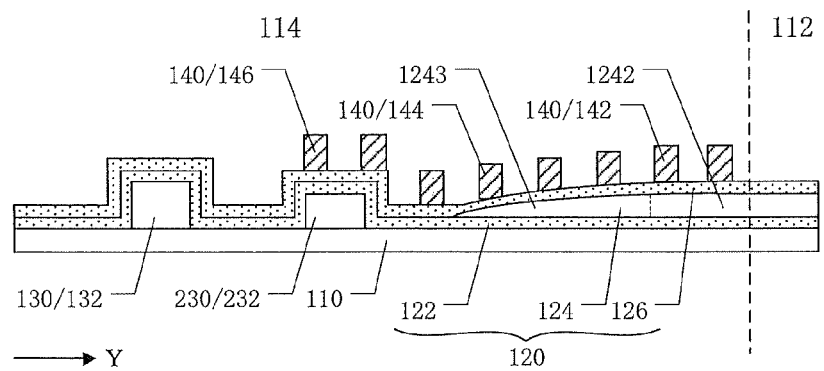
FIG. 13 is a schematic cross-sectional view of an array substrate according to an embodiment of the present disclosure along the GG direction in FIG. 5.

FIG. 12 is a schematic plan view of another array substrate according to an embodiment of the present disclosure. FIG. 13 is a schematic cross-sectional view of an array substrate according to an embodiment of the present disclosure along the GG direction in FIG. 12. As illustrated by FIGS. 12 and 13, the array substrate 100 further includes a second barrier wall 230; the second barrier wall 230 is disposed on the base substrate 110 and located in the peripheral region 114. The second barrier 230 is located between the first barrier 130 and the display region 112; the second barrier 230 includes a third barrier portion 232 extending along the first direction, and the orthographic projection of the first transmission lines 140 on the base substrate 110 is at least partially overlapped with an orthographic projection of the third barrier portion 232 on the base substrate 110. That is, the plurality of first transmission lines 140 are at least partially disposed on the third barrier wall portion 232. In this case, by arranging a plurality of first transmission lines at least partially on the third barrier wall portion, the array substrate can further reduce the width of the peripheral region, thereby further reducing the frame width of the display device adopting the array substrate, thereby achieving the narrow frame design.

It should be noted that, upon a plurality of first transmission lines being at least partially arranged on the third barrier wall, the first inorganic package layer and the second inorganic package layer of the package layer can be arranged on a side of the third barrier wall away from the base substrate, while the first transmission lines arranged on the third barrier wall can be arranged on the side of the second inorganic package layer away from the base substrate.

In some examples, as illustrated by FIG. 13, the plurality of first transmission lines 140 include a plurality of first barrier wall transmission lines 146 located on the third barrier portion 232. That is, the orthographic projection of the plurality of first barrier wall transmission lines 146 on the base substrate 110 falls into the orthographic projection of the third barrier wall portion 232 on the base substrate 110. Therefore, in a common design, because the plurality of first transmission lines are all arranged on the first flat portion, the width of the first flat portion in the second direction Y is relatively large; however, in the array substrate provided by the embodiments of the present disclosure, the first flat transmission lines are formed on the first flat portion, the first slope transmission lines are formed on the first slope portion, and the first barrier wall transmission lines are formed on the third barrier wall portion, so that the number of first transmission lines that need to be disposed on the first flat portion is reduced, thereby reducing the width of the first flat portion in the second direction Y, and further reducing the width of the peripheral region of the array substrate in the second direction Y. Therefore, the display device adopting the array substrate can have a narrow frame.

Figure 14:
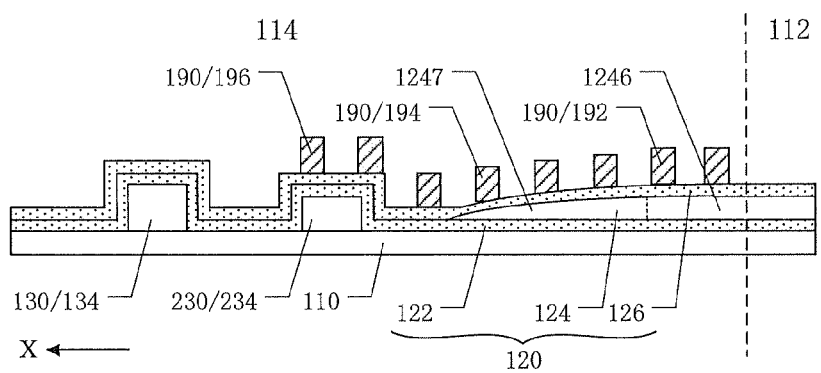
FIG. 14 is a schematic cross-sectional view of an array substrate according to an embodiment of the present disclosure along the HH direction in FIG. 5.

FIG. 14 is a schematic cross-sectional view of an array substrate according to an embodiment of the present disclosure along the HH direction in FIG. 12. As illustrated by FIG. 14, the second barrier wall 230 includes a fourth barrier wall portion 234 extending along the second direction, and the orthographic projection of the plurality of second transmission lines 190 on the base substrate 110 is at least partially overlapped with the orthographic projection of the fourth barrier wall portion 234 on the base substrate 110. That is, the plurality of second transmission lines 190 are at least partially disposed on the fourth barrier wall portion 234. In this case, by arranging a plurality of second transmission lines at least partially on the fourth barrier wall portion, the array substrate can further reduce the width of the peripheral region, thereby further reducing the frame width of the display device adopting the array substrate, thereby achieving the narrow frame design.

In some examples, as illustrated by FIG. 14, the plurality of second transmission lines 190 include a plurality of second barrier wall transmission lines 196 located on the fourth barrier wall portion 234. That is, the orthographic projection of the plurality of second barrier wall transmission lines 196 on the base substrate 110 falls into the orthographic projection of the fourth barrier wall portion 234 on the base substrate 110. Therefore, in the array substrate provided by the embodiment of the present disclosure, the second flat transmission lines are formed on the second flat portion, the second slope transmission lines are formed on the second slope portion, and the second barrier wall transmission line are formed on the fourth barrier wall portion, so that the number of second transmission lines that need to be disposed on the second flat portion is greatly reduced, thereby reducing the width of the second flat portion in the first direction X and further reducing the width of the peripheral region of the array substrate in the first direction X. Therefore, the display device adopting the array substrate can have a narrow frame.

Figure 15:
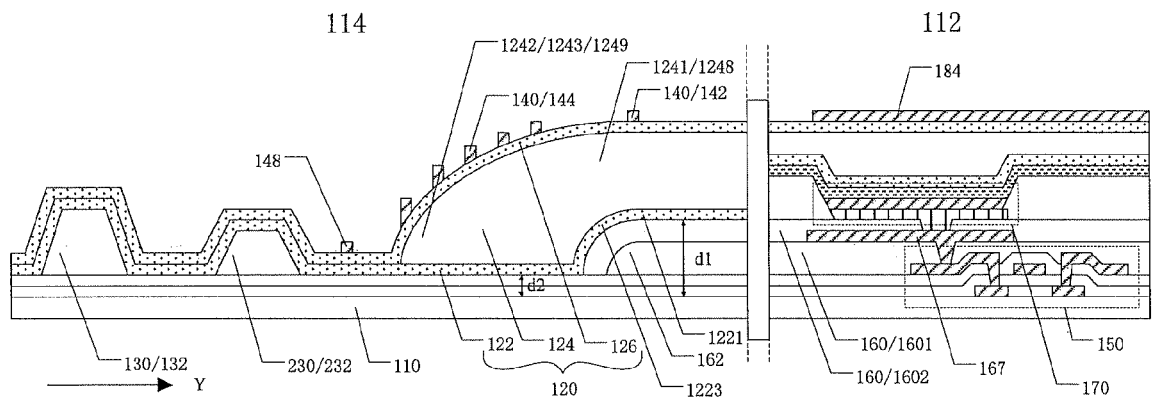
FIG. 15 is a schematic cross-sectional view of an array substrate according to an embodiment of the present disclosure.

An embodiment of the present disclosure also provides an array substrate. FIG. 15 is a schematic cross-sectional view of an array substrate according to an embodiment of the present disclosure. As illustrated by FIG. 15, the array substrate includes a base substrate 110, a pixel driving layer 150, an organic light emitting element 170, a package layer 120 and a plurality of first transmission lines 140. The base substrate 110 includes a display region 112 and a peripheral region 114 located around the display region 112, the pixel driving layer 150 is located on the base substrate 110; the organic light emitting element 170 is located at a side of the planarization layer 160 away from the pixel driving layer 150; the package layer 120 is located at a side of the organic light emitting element 170 away from the base substrate 110, the plurality of first transmission lines 140 are located in the peripheral region 114 and located at a side of the package layer 120 away from the base substrate 110, each of the first transmission lines 140 extends along the first direction X, and the plurality of first transmission lines 140 are arranged along the second direction Y, and the second direction Y is approximately perpendicular to the first direction X. It should be noted that the abovementioned pixel driving layer may include a pixel circuit for driving the corresponding organic light emitting element to perform light emitting display. In addition, the abovementioned second direction is substantially perpendicular to the first direction including the case where the included angle between the first direction and the second direction is equal to 90 degrees and the case where the included angle between the first direction and the second direction is greater than 80 degrees and less than 100 degrees.

As illustrated by FIG. 15, the package layer 120 includes a first inorganic package layer 122 and an organic package layer 124 arranged in sequence. In the peripheral region 114, in a direction from the display region 112 to the peripheral region 114, the first inorganic package layer 122 includes a first inorganic package portion 1221, an inorganic package connection portion 1223 and a second inorganic package portion 1222 which are continuously arranged; the inorganic package connection portion 1223 is used to connect the first inorganic package portion 1221 and the second inorganic package portion 1222. In the peripheral region 114, in the direction from the display region 112 to the peripheral region 114, the organic package layer 124 includes a first organic package portion 1241 and a second organic package portion 1242 arranged continuously, and an edge of the second organic package portion 1242 away from the display region is the edge of the organic package layer 124, the orthographic projection of the first organic package portion 1241 on the base substrate 110 is overlapped with the an orthographic projection of the first inorganic package portion 1221 and the inorganic package connection portion 1223 on the base substrate 110. In the direction perpendicular to the base substrate 110, a distance d1 between the first inorganic package portion 1221 and the base substrate 110 is larger than a distance d2 between the second inorganic package portion 1222 and the base substrate 110, and the orthographic projection of at least one of the first transmission lines 140 on the base substrate 110 falls within the orthographic projection of the second inorganic package portion 1222 on the base substrate 110.

In the array substrate provided by the embodiment of the present disclosure, because the distance d1 between the first inorganic package portion 1221 and the base substrate 110 is larger than the distance d2 between the second inorganic package portion 1222 and the base substrate 110, the distance between the first organic package portion 1241 and the base substrate 110 will suddenly decrease, and the organic package layer 124 will undergo a leveling process, so that the second organic package portion 1242 will form a first slope portion 1243 with gradually decreasing thickness in the peripheral region 114. The array substrate can reduce the number of the first transmission lines arranged on the relatively flat first organic package portion 1241 and even do not arrange the first transmission lines on the first organic package portion 1241 by arranging the orthographic projection of at least one of the first transmission lines 140 on the base substrate 110 into the orthographic projection of the second inorganic package portion 1222 on the base substrate 110 (i.e., the first slope portion 1243 or a side of the first slope portion 1243 away from the display region 112), so as to reduce the width of the first organic package portion 1241, and further reduce the width of the peripheral region 114. Therefore, the array substrate is conducive to achieving the narrow frame or even frameless design of the display device adopting the array substrate.

In some examples, as illustrated by FIG. 15, the array substrate further includes a first barrier wall 130 and a planarization layer 160. The planarization layer 160 is located at a side of the pixel driving layer 150 away from the base substrate 110, the organic light emitting element 170 is located at a side of the planarization layer 160 away from the pixel driving layer 150; the first barrier wall 130 is located in the peripheral region 114 and includes a first barrier wall portion 132 extending in a first direction. The planarization layer 160 includes a first edge portion 162 extending along the first direction, the first edge portion 162 is located between the first barrier wall portion 132 and the display region 112. The orthographic projection of the first inorganic package portion 1221 on the base substrate 110 is overlapped with the orthographic projection of the first edge portion 162 on the base substrate 110, a difference between the distance d1 between the first inorganic package portion 1221 and the base substrate 110 and the distance d2 between the second inorganic package portion 1222 and the base substrate 110 is greater than or equal to a maximum thickness of a portion of the planarization layer 160 which is overlapped with the inorganic package connection portion 1223 in a direction perpendicular to the base substrate 110.

In some examples, as illustrated by FIG. 15, the planarization layer 160 includes a first sub planarization layer 1601 and a second sub planarization layer 1602; the first sub planarization layer 1601 is located at a side of the pixel driving layer 150 away from the base substrate 110, the second sub planarization layer 1602 is located at a side of the first sub planarization layer 1601 away from the pixel driving layer 150. The difference between the distance d1 between the first inorganic package portion 1221 and the base substrate 110 and the distance d2 between the second inorganic package portion 1222 and the base substrate 110 is greater than or equal to a sum of a maximum thickness of a portion of the first sub planarization layer 1601 which is overlapped with the inorganic package connection portion 1223 in the direction perpendicular to the base substrate 110 and a maximum thickness of a portion of the second sub planarization layer 1602 which is overlapped with the inorganic package connection portion 1223 in the direction perpendicular to the base substrate 110.

In some examples, as illustrated by FIG. 15, the plurality of first transmission lines 140 include a plurality of first flat transmission lines 142 located at a side of the first organic package portion 1241 away from the base substrate 110 and a plurality of first slope transmission lines 144 located at a side of the first organic package portion 1242 away from the base substrate 110. A distance between two adjacent ones of the plurality of first slope transmission lines 144 is larger than a distance between two adjacent ones of the plurality of first flat transmission lines 142. Because the first slope transmission lines are formed on the slope, in the process of patterning the conductive film layer to form the first flat transmission lines and the first slope transmission lines, upon the performance of the exposure machine being limited, it is easy to cause underexposure of the first slope transmission line on the slope, which leads to short circuit between two adjacent ones of the plurality of first slope transmission lines. In the array substrate provided in this example, by setting the distance between two adjacent ones of the plurality of first slope transmission lines to be larger than the distance between two adjacent ones of the plurality of first flat transmission lines, the array substrate can avoid various defects such as short circuit caused by underexposure of the first slope transmission lines.

In some examples, a distance between two adjacent ones of the plurality of first slope transmission lines 144 is 1.05-2 times of a distance between two adjacent ones of the plurality of first flat transmission lines 142. Therefore, the array substrate can avoid the exposure problem caused by forming the first slope transmission lines on the first slope portion, thereby avoiding various defects caused by the exposure problem.

For example, the distance between two adjacent ones of the plurality of first slope transmission lines 144 is 1.5 times the distance between two adjacent ones of the plurality of first flat transmission lines 142. On the one hand, the array substrate can avoid the exposure problem caused by forming the first slope transmission lines on the first slope portion; on the other hand, the array substrate can also make the distance between two adjacent ones of the plurality of first slope transmission lines smaller, so that more first slope transmission lines are arranged on the first slope portion.

Of course, embodiments of the present disclosure include, but are not limited thereto, the distance between two adjacent ones of the plurality of first slope transmission lines may be equal to the distance between two adjacent ones of the plurality of first flat transmission lines. For example, the distance between two adjacent ones of the plurality of first slope transmission lines may be equal to that between two adjacent ones of the plurality of first flat transmission lines, but the line width of the first slope transmission lines is larger than the line width of each of the first flat transmission lines.

In some examples, among the plurality of first slope transmission lines 144, the distance between two adjacent ones of the plurality of first slope transmission lines 144 is 1.05-2 times of the width of each of the first slope transmission lines 144. Because the distance between two adjacent ones of the plurality of first slope transmission lines is set to be relatively large, the array substrate can avoid the exposure problem caused by forming the first slope transmission lines on the first slope portion, thereby avoiding various defects caused by the exposure problem. In some examples, as illustrated by FIG. 15, the array substrate further includes a connection electrode 167 between the first sub planarization layer 1601 and the second sub planarization layer 1602, the connection electrode 167 is connected with a drain electrode of a thin film transistor of the pixel driving layer 150 through a via hole in the first sub planarization layer 1601, and an anode of the organic light emitting element 170 is connected with the connection electrode 167 through a via hole in the second sub planarization layer 1602.

Figure 16:
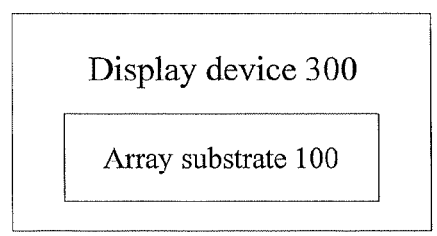
FIG. 16 is a schematic structural diagram of a display device according to an embodiment of the present disclosure.

An embodiment of the present disclosure also provides a display device. FIG. 16 is a schematic structural diagram of a display device according to an embodiment of the present disclosure. As illustrated by FIG. 16, the display device 300 includes the array substrate 100 described above. Because the organic package layer will form a first slope portion with gradually decreased thickness in the peripheral region, the array substrate can reduce the number of first transmission lines on the first flat portion and even not arrange the first transmission line on the first flat portion by arranging at least one first transmission line at a side of the first edge portion away from the display region (i.e., the first slope portion or a side of the first slope portion away from the display region), thereby reducing the width of the first flat portion and further reducing the width of the peripheral region. Therefore, the display device can have a narrow frame, and can also achieve flexible display and flexible touch. Please refer to the relevant descriptions of the above embodiments for details, and the repeated portions are omitted herein.

In some examples, the display device can be an electronic product with display function, such as a mobile phone, a notebook computer, a tablet computer, a navigator, and an electronic photo frame.

The following points should be noted:
(1) Only the structures relevant to the embodiments of the present disclosure are involved in the accompanying drawings of the embodiments of the present invention, and other structures may refer to the prior art.
(2) Features in the same embodiment or in different embodiments of the disclosure may be mutually combined without conflict.

The foregoing is merely exemplary embodiments of the invention, but is not used to limit the protection scope of the invention. Those skilled in the art can easily think of changes or substitutions within the technical scope disclosed in this disclosure, which should be covered within the protection scope of this disclosure. Therefore, the protection scope of this disclosure shall be subject to the protection scope of the claims.

What is claimed is:
1. An array substrate, comprising:
a base substrate, comprising a display region and a peripheral region at the periphery of the display region;
a planarization layer on the base substrate;
a package layer at a side of the planarization layer away from the base substrate;
a first barrier wall in the peripheral region and comprising a first barrier wall portion extending along a first direction; and
a plurality of first transmission lines in the peripheral region and at a side of the package layer away from the base substrate, each of the plurality of first transmission lines extending along the first direction and arranged along a second direction which is substantially perpendicular to the first direction,
wherein the package layer comprises an organic package layer, the planarization layer comprises a first edge portion extending along the first direction, the first edge portion is located between the first barrier wall portion and the display region, an orthographic projection of the first edge portion on the base substrate is covered by an orthographic projection of the organic package layer on the base substrate, and an orthographic projection of at least one of the plurality of first transmission lines on the base substrate is located at a side of the orthographic projection of the first edge portion on the base substrate away from the display region,
the organic package layer comprises a second edge portion extending along the first direction, and the second edge portion is located between the first edge portion and the first barrier wall portion, and an orthographic projection of at least one of the plurality of first transmission lines on the base substrate is located within an orthographic projection of the second edge portion on the base substrate,
the plurality of first transmission lines comprise a plurality of first flat transmission lines at a side of the first edge portion away from the base substrate and a plurality of first slope transmission lines at a side of the second edge portion away from the base substrate, a distance between two adjacent ones of the plurality of first slope transmission lines is larger than a distance between two adjacent ones of the plurality of first flat transmission lines.

2. The array substrate according to claim 1, wherein the distance between two adjacent ones of the plurality of first slope transmission lines is 1.05-2 times of the distance between two adjacent ones of the plurality of first flat transmission lines.

3. The array substrate according to claim 1, wherein, among the plurality of first slope transmission lines, the distance between two adjacent ones of the plurality of first slope transmission lines is 1.05-2 times of a width of each of the plurality of first slope transmission lines.

4. The array substrate according to claim 1, further comprising:
a pixel driving layer on the base substrate; and
an organic light emitting element at a side of the planarization layer away from the pixel driving layer,
wherein the planarization layer is located at a side of the pixel driving layer away from the base substrate, and the package layer is located at a side of the organic light emitting element away from the base substrate.

5. The array substrate according to claim 1, wherein an orthographic projection of one of the plurality of first transmission lines that is farthest from the display region on the base substrate is located between the orthographic projection of the organic package layer on the base substrate and an orthographic projection of the first barrier wall portion on the base substrate.

6. The array substrate according to claim 1, further comprising:
a plurality of touch driving electrodes in the display region and at a side of the package layer away from the base substrate;
a plurality of touch sensing electrodes in the display region and at a side of the package layer away from the base substrate;
touch driving signal lines connected with the respective ones of the plurality of touch driving electrodes and extending to the peripheral region; and
touch sensing signal lines connected with the respective ones of the plurality of touch sensing electrodes and extending to the peripheral region,
wherein at least a part of the plurality of first transmission lines are a part of the touch driving signal lines or the touch sensing signal lines.

7. The array substrate according to claim 1, wherein the first barrier wall comprises a second barrier wall portion extending along the second direction, and the array substrate further comprises:
a plurality of second transmission lines extending along the second direction,
wherein the planarization layer comprises a third edge portion extending along the second direction, the third edge portion is located between the second barrier wall portion and the display region, an orthographic projection of the third edge portion on the base substrate is covered by the orthographic projection of the organic package layer on the base substrate, and an orthographic projection of at least one of the plurality of second transmission lines on the base substrate is located at a side of the third edge portion away from the display region.

8. The array substrate according to claim 7, further comprising:
a plurality of touch driving electrodes in the display region and at a side of the package layer away from the base substrate;
a plurality of touch sensing electrodes in the display region and at a side of the package layer away from the base substrate;
touch driving signal lines connected with the respective ones of the plurality of touch driving electrodes and extending to the peripheral region; and
touch sensing signal lines connected with the respective ones of the plurality of touch sensing electrodes and extending to the peripheral region,
wherein each of the plurality of touch sensing electrodes extends along the first direction, the plurality of touch sensing electrodes are arranged along the second direction, at least a part of the plurality of first transmission lines are a part of the touch sensing signal lines,
each of the plurality of touch driving electrodes extends along the second direction, the plurality of touch driving electrodes are arranged along the first direction, and at least a part of the plurality of second transmission lines are a part of the touch driving signal lines.

9. The array substrate according to claim 7, wherein the organic package layer comprises a fourth edge portion extending along the second direction, the fourth edge portion is located between the third edge portion and the second barrier wall portion, and the orthographic projection of at least one of the plurality of second transmission lines on the base substrate is located within an orthographic projection of the fourth edge portion on the base substrate.

10. The array substrate according to claim 9, wherein the plurality of second transmission lines comprise a plurality of second flat transmission lines located at a side of the third edge portion away from the base substrate and a plurality of second slope transmission lines located at a side of the fourth edge portion away from the base substrate,
a distance between two adjacent ones of the plurality of second slope transmission lines is larger than a distance between two adjacent ones of the plurality of second flat transmission lines.

11. The array substrate according to claim 10, wherein the distance between two adjacent ones of the plurality of second slope transmission lines is 1.05-2 times of the distance between two adjacent ones of the plurality of second flat transmission lines.

12. The array substrate according to claim 10, wherein, among the plurality of second slope transmission lines, the distance between two adjacent ones of the plurality of second slope transmission lines is greater than or equal to 1.05-2 times of a width of each of the plurality of second slope transmission lines.

13. The array substrate according to claim 1, further comprising:
a second barrier wall on the base substrate and in the peripheral region,
wherein the second barrier wall is located between the first barrier wall and the display region, and comprises a third barrier wall portion extending along the first direction,
the orthographic projection of at least one of the plurality of first transmission lines on the base substrate is located within an orthographic projection of the third barrier wall portion on the base substrate.

14. The array substrate according to claim 1, wherein the organic light emitting element comprises an anode, a light emitting layer and a cathode which are sequentially stacked in a direction away from the base substrate.

15. A display device, comprising the array substrate according to claim 1.

16. An array substrate, comprising:
- a base substrate, comprising a display region and a peripheral region at the periphery of the display region;
- a pixel driving layer on the base substrate;
- an organic light emitting element on the pixel driving layer;
- a package layer on the organic light emitting element, the package layer comprising a first inorganic package layer and an organic package layer which are sequentially arranged;
- a plurality of first transmission lines in the peripheral region and at a side of the package layer away from the base substrate, each of the plurality of first transmission lines extending along a first direction, and the plurality of first transmission lines being arranged along a second direction, the second direction being substantially perpendicular to the first direction;
- wherein, in the peripheral region, the first inorganic package layer comprises a first inorganic package portion, an inorganic package connection portion and a second inorganic package portion which are continuously arranged in a direction from the display region to the peripheral region, and the inorganic package connection portion is configured to connect the first inorganic package portion and the second inorganic package portion;
- in the peripheral region, the organic package layer comprises a first organic package portion and a second organic package portion which are arranged continuously in the direction from the display region to the peripheral region, an edge of the second organic package portion away from the display region is an edge of the organic package layer, and an orthographic projection of the first organic package portion on the base substrate is overlapped with orthographic projections of the first inorganic package portion and the inorganic package connection portion on the base substrate, and an orthographic projection of the second organic package portion on the base substrate is overlapped with an orthographic projection of the second inorganic package portion on the base substrate;
- in a direction perpendicular to the base substrate, a distance d1 between the first inorganic package portion and the base substrate is larger than a distance d2 between the second inorganic package portion and the base substrate, and an orthographic projection of at least one of the plurality of first transmission lines on the base substrate falls within the orthographic projection of the second inorganic package portion on the base substrate,
- the plurality of first transmission lines comprise a plurality of first flat transmission lines at a side of the first organic package portion away from the base substrate and a plurality of first slope transmission lines at a side of the second organic package portion away from the base substrate,
- a distance between two adjacent ones of the plurality of first slope transmission lines is larger than a distance between two adjacent ones of the plurality of first flat transmission lines.

17. The array substrate according to claim 16, wherein the distance between two adjacent ones of the plurality of first slope transmission lines is 1.05-2 times of the distance between two adjacent ones of the plurality of first flat transmission lines.

* * * * *